US009553248B2

(12) United States Patent
Lang

(10) Patent No.: US 9,553,248 B2
(45) Date of Patent: *Jan. 24, 2017

(54) SYSTEMS, METHODS AND/OR DEVICES FOR PROVIDING LED LIGHTING

(75) Inventor: Daniel Stewart Lang, Las Vegas, NV (US)

(73) Assignee: Photon Holding LLC, Las Vegas, NV (US)

( * ) Notice: Subject to any disclaimer, the term of this patent is extended or adjusted under 35 U.S.C. 154(b) by 451 days.

This patent is subject to a terminal disclaimer.

(21) Appl. No.: 13/885,992

(22) PCT Filed: Nov. 16, 2011

(86) PCT No.: PCT/US2011/060942
§ 371 (c)(1),
(2), (4) Date: Jun. 21, 2013

(87) PCT Pub. No.: WO2012/068221
PCT Pub. Date: May 24, 2012

(65) Prior Publication Data
US 2013/0265767 A1    Oct. 10, 2013

Related U.S. Application Data

(60) Provisional application No. 61/532,104, filed on Sep. 8, 2011, provisional application No. 61/413,995, filed on Nov. 16, 2010.

(51) Int. Cl.
*H01L 35/28* (2006.01)
*H01L 35/30* (2006.01)
*F21S 4/00* (2016.01)

(52) U.S. Cl.
CPC .............. *H01L 35/28* (2013.01); *F21S 4/00* (2013.01); *H01L 35/30* (2013.01)

(58) Field of Classification Search
USPC .............................. 362/249.02, 294
See application file for complete search history.

(56) References Cited

U.S. PATENT DOCUMENTS

| | | | |
|---|---|---|---|
| 2004/0114355 A1* | 6/2004 | Rizkin et al. | 362/153 |
| 2004/0120156 A1* | 6/2004 | Ryan | 362/373 |
| 2006/0088271 A1 | 4/2006 | Ghoshal | |
| 2006/0151801 A1 | 7/2006 | Doan et al. | |

(Continued)

FOREIGN PATENT DOCUMENTS

| | | |
|---|---|---|
| CN | 101057114 A | 10/2007 |
| JP | 2006-073447 | 3/2006 |

(Continued)

OTHER PUBLICATIONS

International Search Report dated Mar. 8, 2012 for PCT/US2011/060942.

*Primary Examiner* — Laura Tso
(74) *Attorney, Agent, or Firm* — Jones Day

(57) ABSTRACT

A lighting device comprising a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

14 Claims, 18 Drawing Sheets

(56) References Cited

U.S. PATENT DOCUMENTS

| | | | |
|---|---|---|---|
| 2006/0163590 A1 | 7/2006 | Erchak et al. | |
| 2007/0008727 A1* | 1/2007 | Chinniah et al. | 362/294 |
| 2007/0153159 A1 | 7/2007 | Jung | |
| 2008/0013320 A1* | 1/2008 | Tain et al. | 362/294 |
| 2008/0298069 A1* | 12/2008 | Chu | 362/294 |
| 2009/0059594 A1* | 3/2009 | Lin | 362/294 |
| 2009/0175035 A1 | 7/2009 | Jiang | |
| 2010/0207573 A1 | 8/2010 | Mo et al. | |
| 2011/0235328 A1* | 9/2011 | Xu et al. | 362/249.02 |

FOREIGN PATENT DOCUMENTS

| | | |
|---|---|---|
| JP | 2006-165029 | 6/2006 |
| JP | 2009-099406 | 5/2009 |
| JP | 2009-266573 | 11/2009 |
| JP | 2010-257763 | 11/2010 |

\* cited by examiner

SYSTEMS, METHODS AND/OR DEVICES FOR PROVIDING LED LIGHTING

CROSS-REFERENCE TO RELATED APPLICATIONS

This application is the National Phase application of International Application No. PCT/US2011/060942, filed Nov. 16, 2011,which designates the United States and was published in English, which claims priority to U.S. Provisional Application No. 61/413,995, filed on Nov. 16, 2010 and U.S. Provisional Application No. 61/532,104, filed Sep. 8, 2011. This application is also related to PCT Application No. PCT/US2011/060937, entitled "Systems, Methods and/or Apparatus for Thermoelectric Energy Generation," filed on Nov. 16, 2011. Each of these applications are herein incorporated by reference in their entirety.

FIELD

This disclosure generally relates to systems, methods, and devices for providing LED lighting. This disclosure also relates to systems, methods, and devices for providing LED lighting with reduced energy consumption.

BACKGROUND

LED lighting has come to the forefront as a more efficient means of providing household and commercial lighting. In contrast to most conventional lighting techniques, LEDs generally require electrical flow in one direction or direct current ("DC") in order to produce light. Since standard building wiring throughout the world is alternating current ("AC"), LED lighting designs typically take one of two prevailing approaches to insure sustainable light.

The first approach utilizes a driver circuit that converts AC to DC, steps down, and conditions the power. A typical converter design currently in the market utilizes up to eighty components to achieve the conversion and may use additional components if dimming is required. The second approach is to use AC LED technology.

These systems can be complex and inefficient because much of the energy is emitted as heat and the system does not manage the heat loss effectively. Additionally, there are inefficiencies caused by interference from within the system.

Accordingly, it would be desirable to have a system that managed the emitted heat in a more effective manner and reduced the inefficiencies caused by interference from within the system.

SUMMARY

In exemplary embodiments of LED lighting systems, methods, and devices, the LEDs may be isolated or substantially isolated from each other to avoid or reduce optical, thermal, and/or electrical interference associated with the production of visible light.

Exemplary embodiments may provide a method for blocking the adverse effects on LEDs of light produced by adjacent LEDs in LED arrays. For example. when light from one LED (the first LED) hits another LED (the second LED) there may be at least two different things that negatively affect the ability of the second LED to produce light. First, the reflected light creates a voltage in the second LED (i.e., electrical interference) which negatively affects the ability of the second LED to produce photons. Second, the light emitted by the first LED reflects off the lens covering the second LED (i.e., optical interference) reducing the ability of the second LED to emit it's own light producing photons.

In exemplary embodiments, a lens between the LEDs may be utilized to block the path of light from one LED to another LED. These lenses or shields reduce and/or eliminate at least one or both of the electrical and optical interference of the first LED on the second LED.

In exemplary embodiments, active heat management may be implemented using a thermoelectric device(s) that convert heat generated by the LEDs or other components (including, e.g., the sun) into electrical energy that is used to cool the LEDs.

In exemplary embodiments, thermoelectric generators adjacent to the LEDs and/or transformers may be used to convert the emitted heat into electrical energy. In exemplary embodiments, the electrical energy may be used to power a thermoelectric device(s) that actively cools the LEDs. In exemplary embodiments, this approach may be advantageous to typical passive aluminum heat sinks since the heat sink simply removes the heat but is unable to utilize it for any purpose.

In exemplary embodiments, a pair of AC powered LEDs with opposite polarity may be used to produce constant light. In exemplary embodiments, the paired LEDs when positioned in close proximity to each other produce a steady stream of light without a noticeable strobe effect notwithstanding that each LED is cycling at e.g., between 50-60 pulses per second.

In exemplary embodiments, power control at the component level may be utilized to minimize and/or reduce power consumption and optimize and/or improve performance. By properly sizing components to draw just the power that is needed for the application, exemplary embodiments may reduce and/or minimize the amount of power that is drawn and dissipated as heat. In exemplary embodiments, the device and/or system may utilize only a few components to produce light from the LEDs. For example, in exemplary embodiments, the main component may be a step transformer that may be governed by two resistors. In exemplary embodiments, there may be no special driver board or dimmer boards required in any application. Additionally, in exemplary embodiments, the active heat management system may have no outside power consumption as it may be powered by wasted energy and may be on an entirety isolated circuit.

In exemplary embodiments the LED lighting may not require the conversion of power from AC to DC or the storage of current as used by current systems, each of which results in loss of energy. Thus in exemplary embodiments, the LED lighting may:

eliminate and/or reduce the need for costly driver circuitry used by current systems to convert power from AC to DC;

eliminate and/or reduce the need for capacitor circuitry used by current systems to store power for use in off cycles;

eliminate and/or reduce the need for special circuitry used by current systems to allow for dimming. In exemplary embodiments, a standard dimmer may be used to dim the LED lighting;

be more reliable than previous systems;

manage heat more effectively;

extended the life of the LEDs since each LED is only powered half of the time of operation, in effect, doubling, or substantially doubling its life;

eliminate, or at least reduce, the use of circuit boards for more effective thermal management.

eliminate, or at least reduce, the use of the reflow process to minimize, or at least reduce, damage to the LED in the fixture manufacturing process; and reduce the number of types of components for the LED lighting device to just the LED.

In exemplary embodiments, the life of the LED may be extended because of any combination of the following: (1) half operation of the LEDs as discussed in exemplary double string A/C embodiments; (2) reducing the current through each LED by using more LEDs per fixture; (3) maintaining the LEDs in a cooler operating and ambient temperature; (4) not subjecting the LEDs to the high temperatures of a reflow process often used in populating circuit boards; (5) eliminating, or at least reducing, the printed circuit board primarily used for LED lighting and utilizing a substrate that eliminates, or at least reduces, thermal build up around the LEDs; and/or (6) eliminating, or at least reducing, the printed circuit board primarily used for LED lighting and utilizing the substrate that is part of a system to harvest the unwanted LED thermal energy.

Exemplary embodiments may provide a lighting device comprising: a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

In exemplary embodiments of the lighting device at least one optical separator substantially prevents a change in refractive index of the other lights.

In exemplary embodiments of the lighting device at least one optical separator substantially prevents a photovoltaic effect on the other lights.

In exemplary embodiments of the lighting device the low temperature material is a phase change material.

In exemplary embodiments of the lighting device the generated electrical energy is used to aid in maintaining the low temperature material at a low temperature.

In exemplary embodiments of the lighting device the generated electrical energy is used to aid in powering at least one additional LED.

In exemplary embodiments of the lighting device the lighting device is supplied with DC voltage.

In exemplary embodiments, the DC power may be harvested from the site where the light is needed, e.g., waste thermal energy from a water line or other local process, radio waves, sunlight, etc.

In exemplary embodiments of the lighting device the lighting device is supplied with AC voltage and at plurality of LEDs are arranged such that about 50% are in a first polarity and about 50% are in a reverse polarity.

Exemplary embodiments may provide a lighting device comprising: a plurality of lighting means for providing light; a plurality of optic means corresponding to the plurality of lighting means; at least one optical separator means for substantially preventing the light emitted from one lighting means from effecting the other lighting means; thermoelectric means configured to harvest heat generated by the lighting means and convert the harvested heat into electrical energy; and a low temperature means for creating a temperature difference across the thermoelectric device.

In exemplary embodiments, the lighting means may be LEDs.

In exemplary embodiments of the lighting device at least one optical separator means substantially prevents a change in refractive index of the other lights.

In exemplary embodiments of the lighting device at least one optical separator means for substantially preventing a photovoltaic effect on the other lights may be provided.

In exemplary embodiments of the lighting device the low temperature means is a phase change material.

In exemplary embodiments of the lighting device the generated electrical energy is used to aid in maintaining the low temperature means for storing thermal energy at a low temperature.

In exemplary embodiments of the lighting device the generated electrical energy is used to aid in powering at least one additional lighting means.

In exemplary embodiments of the lighting device the generated electrical energy may be used to aid in powering a device not associated with the lighting device but able to be powered by the generated energy e.g., smoke detectors, motion detectors, cameras, etc.

In exemplary embodiments of the lighting device the generated electrical energy may be used to aid in powering a device associated with the lighting device that is able to be powered by the generated energy e.g., timers, controllers, servos, etc.

In exemplary embodiments of the lighting device the lighting device is supplied with DC voltage.

In exemplary embodiments, the DC power may be harvested from the site where the light is needed, e.g., waste thermal energy from a water line or other local process, radio waves, sunlight, etc.

In exemplary embodiments of the lighting device the lighting device is supplied with AC voltage and at plurality of lighting means are arranged such that about 50% are in a first polarity and about 50% are in a reverse polarity In exemplary embodiments of the lighting device the lighting device may be supplied with AC voltage and at plurality of LED means are arranged such that about 50% are in a first polarity and about 50% are in a reverse polarity and the voltage is stepped up or down by use of a transformer with governing resistance.

In exemplary embodiments of the lighting device the lighting device may be supplied with AC voltage where the number of LEDs placed in series equals the A/C input voltage to reduce (or substantially eliminate) the efficiency loss of a transformer.

In exemplary embodiments of the lighting device the lighting device may be supplied with AC voltage and at plurality of LEDs means are arranged such that about 50% are in a first polarity and about 50% are in a reverse polarity and the lighting device is supplied with AC voltage where the forward voltage of the LED's placed in series match the supplied AC voltage to eliminate the efficiency loss of a transformer.

In exemplary embodiments of the lighting device the lighting device may be supplied with AC voltage and the first four LEDs are configured as diodes in a typical rectifying pattern where the reverse current allowable for the LEDs is not exceeded giving the remaining LED DC power and the forward voltage of the LED's placed in series matching the supplied AC voltage.

In exemplary embodiments of the lighting device the lighting device may be supplied with AC voltage and the first four LEDs are configured as diodes in a typical rectifying pattern where the reverse current allowable for the LEDs is not exceeded giving the remaining LED DC power and the voltage is stepped up or down by use of a transformer with governing resistance.

DESCRIPTION OF THE DRAWINGS

Exemplary embodiments will now be described, by way of example only, with reference to the accompanying drawings in which.

DESCRIPTION OF EXEMPLARY EMBODIMENTS

LED lighting is a more efficient way of providing lighting in a variety of situations. The technology is also greener and often more cost effective than conventional lighting. As would be understood by a person of ordinary skill in the art, LED lighting uses less energy to produce comparable quantities of light thereby reducing the amount of energy being consumed, LEDs also generally last longer than conventional lighting thereby reducing the frequency of replacement. However, there are still some inefficiencies with LED lighting. Some of these inefficiencies (i.e., heat generation) are a result of the LED itself but others are the result of the system design. By reducing at least one of these inefficiencies, the LED lighting can be even more useful.

of providing household and commercial lighting. In contrast to most conventional lighting techniques, LEDs generally require electrical flow in one direction or direct current ("DC") in order to produce light. Since standard building wiring throughout the world is alternating current ("AC"), LED lighting designs typically take one of two prevailing approaches to insure sustainable light.

Figure 1:
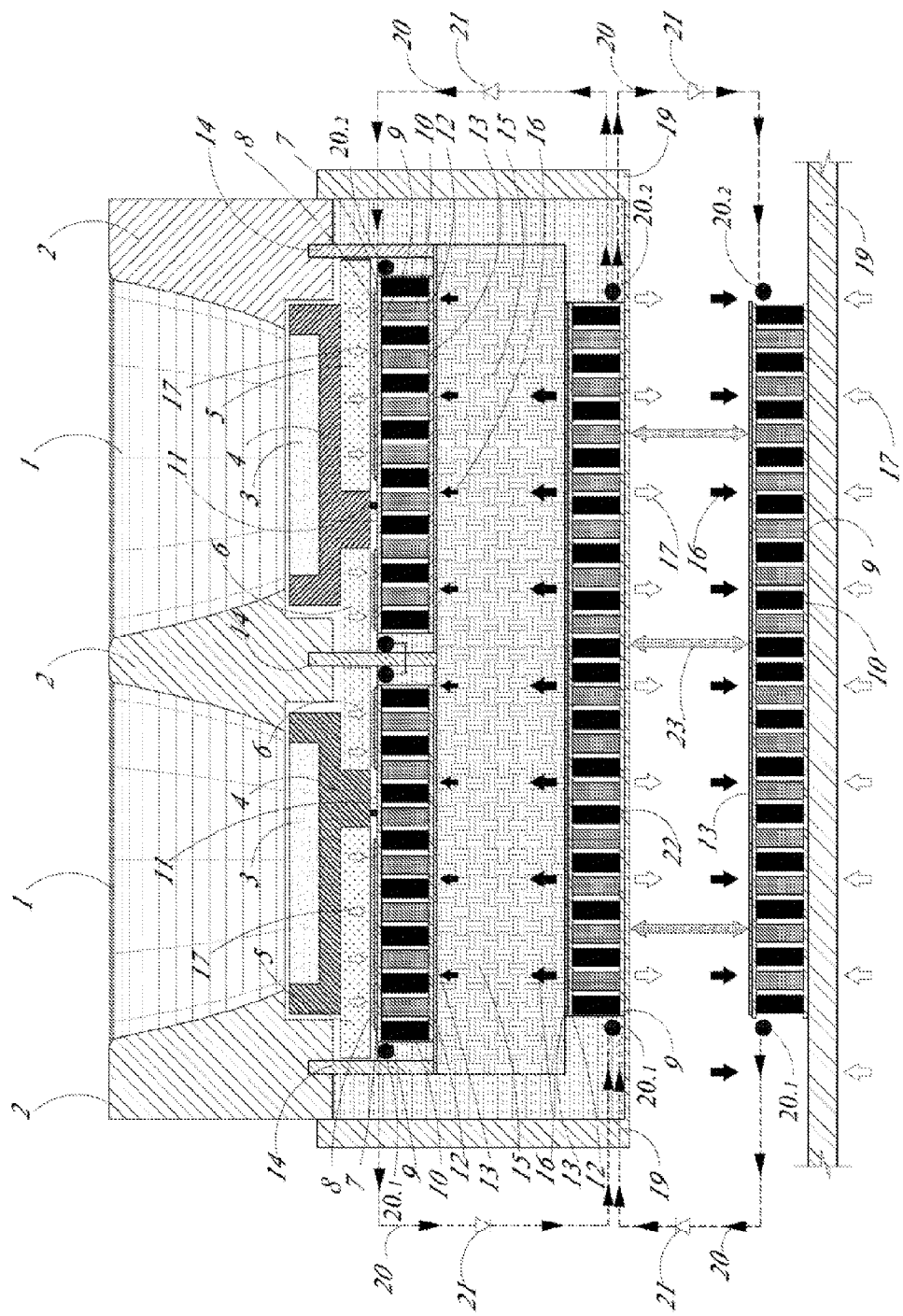
FIG. 1 is a schematic diagram of an exemplary LED lighting device.

FIG. 1 is a schematic diagram of an exemplary LED lighting device. In FIG. 1, an individual optic device 1 is used for each LED in the exemplary fixture. An optic separator 2 may be set at the edge of the LED lens 3 and may be a part of or be separate from the optic device 1. This arrangement may help to ensure that substantially less, little to no stray light from the other LEDs or elsewhere cause a reflection across the protected LED thus changing its refractive index or otherwise causing an unwanted photovoltaic effect on the semiconductor at the base of the LED lens 3. As shown in FIG. 1, the LED lens 3 may be seated in an LED die 4. In exemplary embodiments, the LED anode 5 and LED cathode 6 may be connected to the fixture circuit layer 7 using electrically and thermally conductive epoxy 8 that may cure at a temperature below 70° C., to avoid high temperatures (e.g., >260° C.). typically used by the electronics industry in reflow ovens. As would be understood by persons of ordinary skill in the art, the oven temperatures may be more than those considered safe for LEDs. Exposure to these high temperatures causes loss in lifetime. In exemplary embodiments, limiting the exposure of the LEDs to temperatures below 70° C. (e.g., below 100° C., below 90° C., below 80° C., below 75° C., below 70° C., below 65° C., below 60° C., below 50° C., etc.) may extend the duty cycle of the LEDs.

In exemplary embodiments. the circuit layer 7 may be a semiconductor device specific electrically conductive pad and trace layer applied directly to the thermally conductive, but electrically non-conductive, thermoelectric device substrate (hot side) 9 of a thermoelectric device 10. In exemplary embodiments, this may be accomplished by way of printing, etching or fastening, that eliminates the use of circuit boards. The elimination of the circuit board may achieve two benefits; firstly, it may allow for a direct path of component thermal waste energy away from the component eliminating the common heat buildup into the circuit board's dielectric layer that has negative effects on the components and secondly, it may make possible the use of a printed, etched or fastened trace to the substrate as a resistor eliminating circuit components.

The LED circuit begins and ends with LED power supply connectors 11 and in exemplary embodiment no driver board may be required as the circuit layer 7 may be engineered to include the LED component specific current and voltage resistance and/or impedance in the case of alternating current. The thermoelectric device substrate (cold side) 12 of the thermoelectric device 10 is fastened, using known methods practiced for thermoelectric devices, to a thermally conductive substrate 13. The thermally conductive substrate 13 may include thermally conductive vertical path walls 14 that attach to the optic separator 2 to chill the ambient temperature of the LEDs and may also be part of the containment structure for low temperature phase change material storage 15.

In operation, when electrical energy is connected to the circuit layer 7 by way of the LED power supply connectors 11, the connected LEDs emit light as intended but also produce waste heat through the LED anode 5 and LED cathode 6. The waste heat is drawn away through the thermoelectric device 10 towards the low temperature phase change material storage 15 in a calculable and definable high temperature flow direction 17. The design temperature of the low temperature phase change material storage 15, the low temperature flow direction 16, the thermal energy produced by the LEDs, and the thermal resistivity of the thermoelectric device 10 determines the amount of wasted heat energy converted back into electrical energy. Parts of the low temperature phase change material storage 15 that is not desired to be thermally conductive may be constructed using a thermal insulating barrier 18 to aid in maintaining the temperature of the low temperature phase change material storage 15.

Another source of heat to create a high temperature flow direction 17 through the thermoelectric device 10 towards the low temperature phase change material storage 15 and generate electrical energy is the fixture's outer housing 19—especially in outdoor fixtures during daytime hours as long as there is a thermally conductive link 23 to the low temperature phase change material storage 15. The electricity generated by the processes described herein moves as a direct current flow 20 from the positive leads 20.1 of the thermoelectric device 10 through protection diodes 21 (designed to confine the flow in one direction) and onto the positive lead 20.1 of the thermoelectric chiller 22 which continually chills the low temperature phase change material storage 15 and out the negative lead 20.2 through protection diodes 21 and onto the negative lead 20.2 of the thermoelectric device 10, completing the circuit.

In exemplary embodiments, this electrical circuit may be substantially separated or completely separate from the circuit powering the LEDs. In exemplary embodiments, the power supply for the LED circuit may be done without secondary circuits because of the current and voltage regulating circuit layer 7. In the case of DC power, which in exemplary embodiments may be desirable, the selection of the proper DC power source voltage and amperage per the LED manufacture's specifications may be sufficient to what is required. In the case of AC power, exemplary embodiments may employ the use of a transformer that converts the in-coming voltage and amperage to the desired power source voltage and amperage of the LEDs per the LED manufacture's specifications Additionally, in exemplary embodiments, the LED circuit may have equal LEDs set on the circuit layer 7 in reverse polarity and set in close proximity to its opposite LED, so as to use both sides of the electrical wave pattern. The use of resistors on both leads of the high voltage portion of the transformer may be suggested to maintain a longer transformer life. A method of eliminating the transformer may be to use a large number of LEDs in series to match the high voltage in buildings and use the first four LEDs to act as blocking diodes in a rectifying circuit configuration. Two of the fourLEDs would alternate and the rest of the LEDs would get a direct current. To eliminate flicker on the four LEDs, in exemplary embodiments, the alternating pairs may be close to one another or cover the same area at the working surface the LED lighting is intended for.

In exemplary embodiments, the LED components prior to being used in a lighting system may have an efficacy of 150 lm/w at 2.86V and 350 mA with a 25° C. Ambient and Solder Junction Temperature and a Lifecycle of 100,000 hours (lifecycle may be to 70% efficiency) as may be specified by LED manufacturers.

Typical industry fixtures may have one or more of the following features:
  A driver board designed for 3V and 500 mA (power mismatch and current overdrive): −30 lm/w—Lifecycle loss 5%;
  Driver board loss (NC to D/C and rectifying-smoothing): −40 lm/w—Lifecycle loss 0%;
  The light may be mounted on PCB using reflow oven (heat damage to LED integrated optics): −2 lm/w—Lifecycle loss 18%;
  Thermal design of fixture may not remove/reduce ambient heat: −5 lm/w—Lifecycle loss 22%;
  The thermal design of the fixture may not remove/reduce solder junction heat: −5 lm/w—Lifecycle loss 10%;
  Optical light spillover: −12 lm/w—Lifecycle loss 5%.

As a result of these inefficiencies, typical lighting solutions may have one or more of the following limitations:
  The LED Efficacy may drop from 150 lm/w to 56 lm/w;
  The LED Lifecycle may drop from 100,000 hours to 40,000 hours (manufactures generally do not give more than a 5 year warranty);
  Other drawbacks may include:
    Other components on driver board may fail sooner;
    Driver board may cause more heat due to more components;
    Heat transfer methods may not work in fixture housings like ceiling cans;
    Outdoor fixtures subject to hot and cold changes daily may cause damage to PCB by expansion and contraction;
    More components and larger heat sinks cost more;
    Since most fixtures share optics in an array, a large percentage, (sometimes as great as 80%) of the lumens that are not lost from the above mentioned reasons, may not hit the working surface the fixture is intended for.

Using the features of the exemplary embodiments described herein, the LED lighting may have one or more of the following features:

- A power source design for about 2.78V and 80 mA (e.g., substantial power match to LED specifications): +72.57 lm/w (e.g., 20 lm/w, 30 lm/w, 40 lm/w, 50 lm/w, 60 lm/w, 70 lm/w, 75 lm/w, 80 lm/w, 90 lm/w, etc.)—Lifecycle gain 600% (e.g., 50%, 100%, 200%, 300%, 400%, 500%, 700%, 800%);
- The LEDs may be mounted on the TEG substrate using conductive paste: +/−0 lm/w—Lifecycle loss 0% (e.g., substantially no lifecycle loss);
- An active thermal design of fixture to remove/reduce ambient heat: +8 lm/w (e.g., 4 lm/w, 5 lm/w, 6, lm/w, 7 lm/w, 9 lm/w, 10 lm/w, 15 lm/w, etc.)—Lifecycle Gain 100% (e.g., 20%, 30%, 40%, 50%, 60%, 70%, 80%, 90%, 100%, 110%, 120%, 130%, 140%, 150%);
- An active thermal design of fixture to remove solder junction heat to: +5 lm/w (e.g., 4 lm/w, 5 lm/w, 6, lm/w, 7 lm/w, 9 lm/w, 10 lm/w, 15 lm/w, etc.)—Lifecycle Gain 100% (e.g., 20%, 30%, 40%, 50%, 60%, 70%, 80%, 90%, 100%, 110%, 120%, 130%, 140%, 150%);
- The harvested thermal energy may be converted back to light: +6 lm/w (e.g., 4 lm/w, 5 lm/w, 6, lm/w, 7 lm/w, 9 lm/w, 10 lm/w, 15 lm/w, etc.)—Lifecycle Gain 0% (e.g., substantially no lifecycle loss).
- Minimal optical loss from lens or reflectors: −3% lm/w—(e.g., 1 lm/w, 2 lm/w, 3 lm/w, 4 lm/w, 5 lm/w, 6 lm/w, 7 lm/w, etc.)—Lifecycle Loss 0% (e.g., substantially no lifecycle loss)

As a result of one or more of these features, exemplary embodiments may experience one or more of the following improvements:

- LED Efficacy: raised from 150 lm/w to 234.32 lm/w (e.g., an improvement of 25%, 30%, 40%, 50%, 55%, 60%, 70%, 75%, 80%, 90%, 100%, etc.);
- LED Lifecycle: raised from 100,000 hours to 800,000 hours (e.g., 150,000, 200,000, 250,000, 300,000, 350,000, 400,000, 450,000, 500,000, 550,000, 600,000, 650,000, 700,000, 750,000, 800,000, 850,000, 900,000, 1,000,000 hours, etc.) or a life cycle extension of e.g., 100%, 200%, 300%, 400%, 500%, 600%, 700%, etc.;
- Other advantages may include one or more of the following:
  - Few/no other components necessary;
  - Ease of manufacture, smaller BOM;
  - Heat transfer methods may work in a number of fixture housings and environments;
  - Outdoor fixtures may benefit from harvesting heat from the sun cold thermal energies at night;
  - Fewer components so my cost less;
  - Optic design at individual LED level improves the percentage of the lumens that reach the intended working surface;
  - It may be possible to harvest more thermal energy to run another type of sub system, e.g., camera, signal, sensors, etc.

Figure 2:
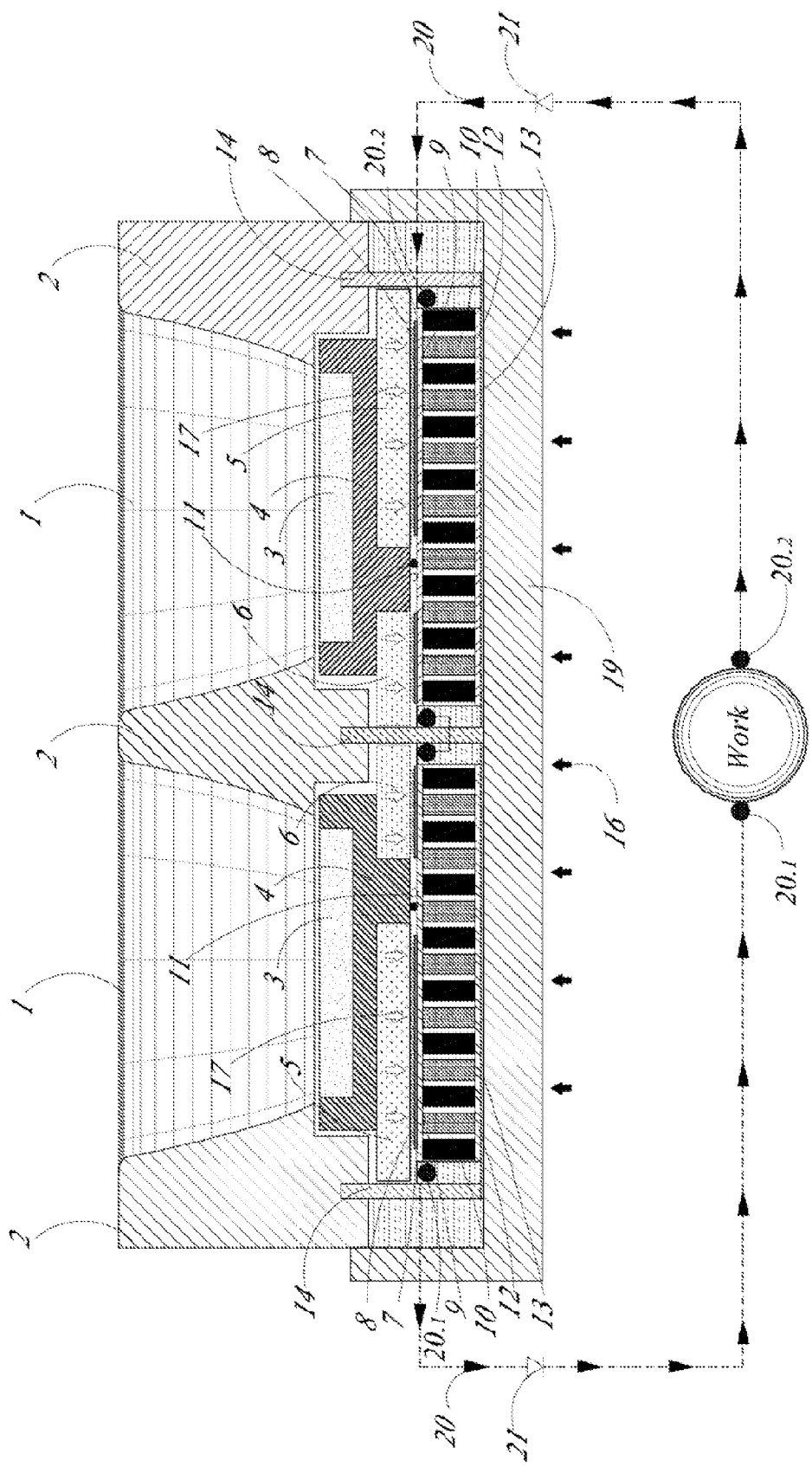
FIG. 2 is a schematic diagram of an exemplary LED lighting device.

FIG. 2 is a schematic diagram of an exemplary LED lighting device. The embodiment illustrated in FIG. 2 is similar to the embodiment described above with respect to FIG. 1 except the cold side of the thermoelectric device is in contact with a thermally conductive outer housing 19. This arrangement assumes that the ambient temperature is lower than the temperature of the waste heat so the thermoelectric device produces electrical energy. Of course, as would be understood by a person of skill in the art, the electrical energy generated could be used for a of a number of purposes, e.g., powering a camera, sensor, alarm, etc., or combinations thereof.

Figure 3:
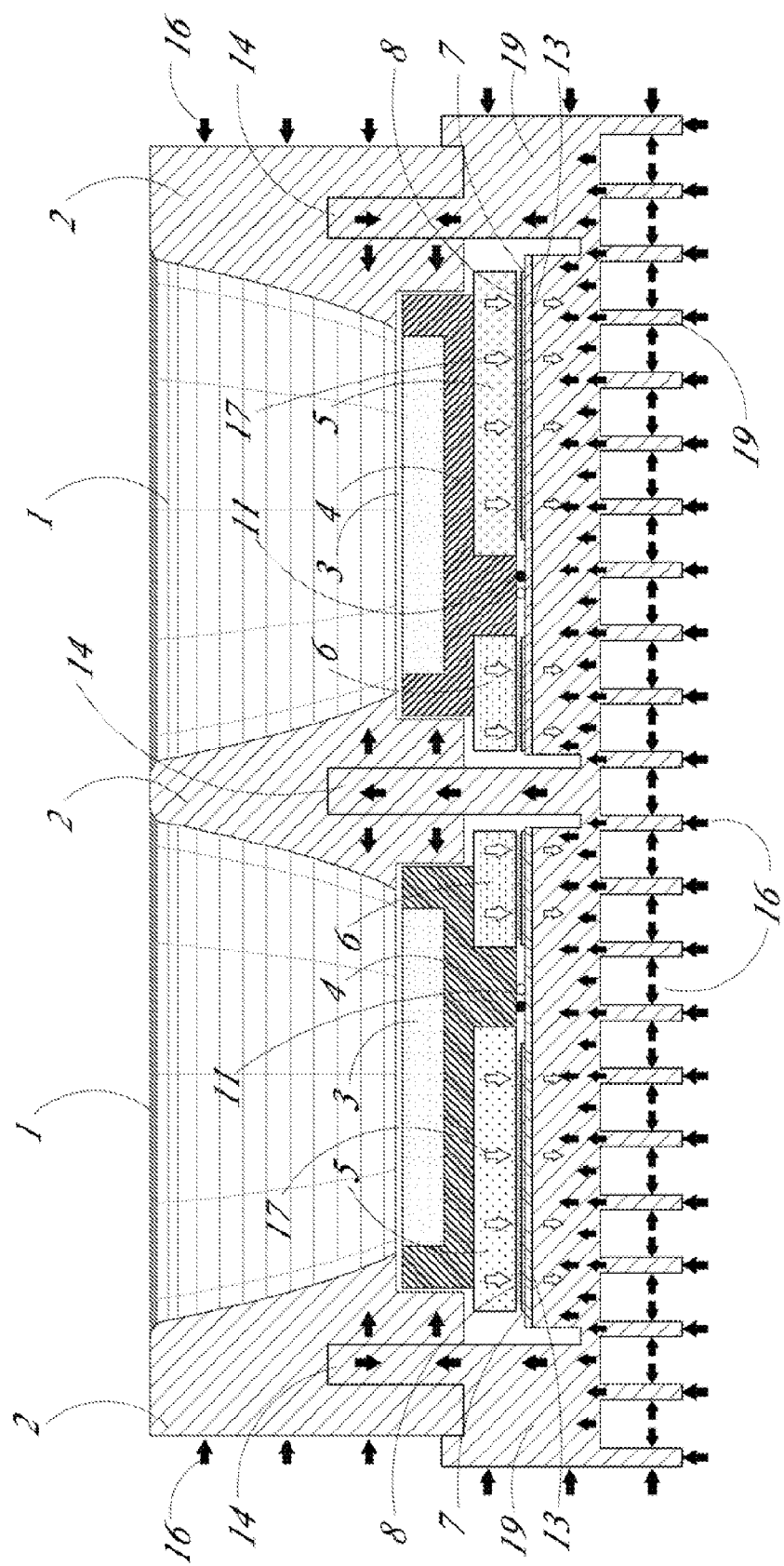
FIG. 3 is a schematic diagram of an exemplary LED lighting device.

FIG. 3 is a schematic diagram of an exemplary LED lighting device. In this embodiment, much like the embodiment of FIG. 2, there is no phase change material. However, in this case, there is also no thermoelectric device. Accordingly, the housing 19 acts in a known manner to dissipate heat from the LEDs. Of course, as would be understood by a person of ordinary skill in the art, this embodiment may still use the optics described herein. Additionally, as illustrated in this exemplary embodiment, the housing 19 includes "island" pads in the shape of the substrates 13 for better heat isolation.

Figure 4:
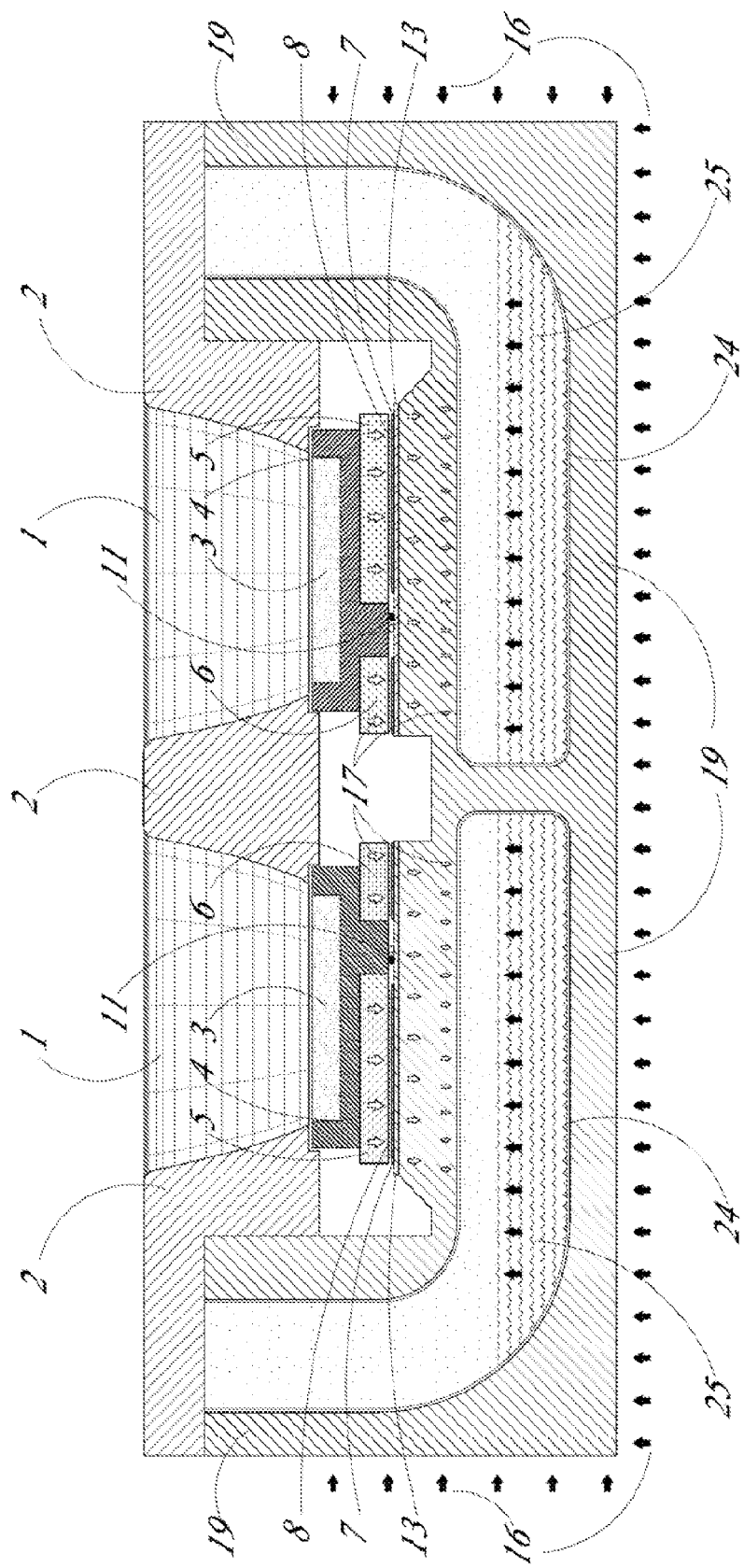
FIG. 4 is a schematic diagram of an exemplary LED lighting device.

FIG. 4 is a schematic diagram of an exemplary LED lighting device. This embodiment is similar to the embodiment of FIG. 3 except the outer housing 19 includes sintered heat pipes 24 and working fluid 25. The heat pipes 24 and working fluid 25 aid in drawing away the waste heat from the LEDs.

Figure 5:
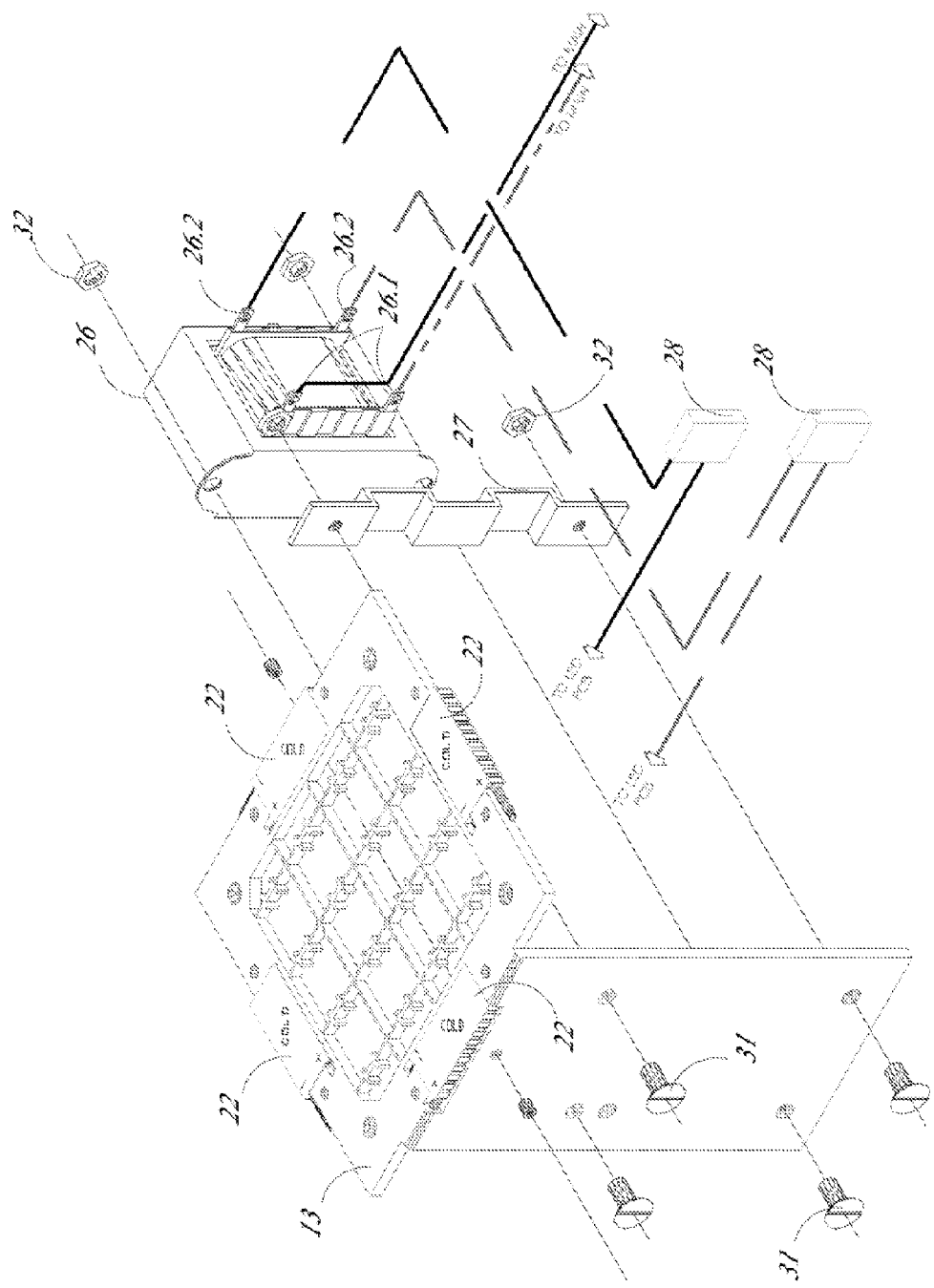
FIG. 5 is a schematic diagram of an exemplary transformer assembly for use in an LED lighting assembly.
Figure 8:
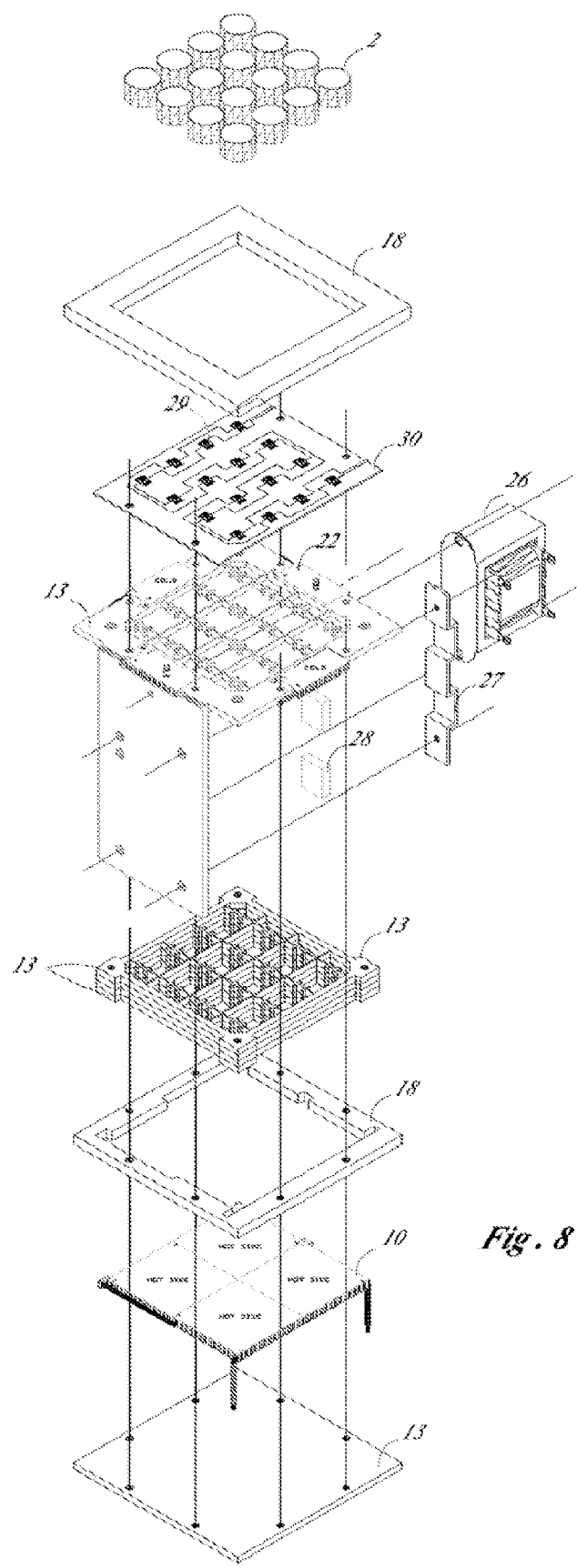
FIG. 8 is a schematic diagram of an exemplary active heat management system for use in an LED lighting assembly.

FIG. 5 is a schematic diagram of an exemplary transformer assembly for use in an LED lighting assembly. In exemplary embodiments, the LED lighting assembly may utilize a thermally isolated standard step-down power transformer 26 to more precisely match the input voltage and current to the LED manufacture's specifications. The resistors 28 may be sized to limit the power drawn from the transformer 26 so as not to overheat the transformer and reduce it's lifespan. The waste thermal energy from the transformer 26 and Resistors 28 clamped against a Thermally Conductive Substrate 13 may also be harvested as shown in FIG. 8

Figure 6:
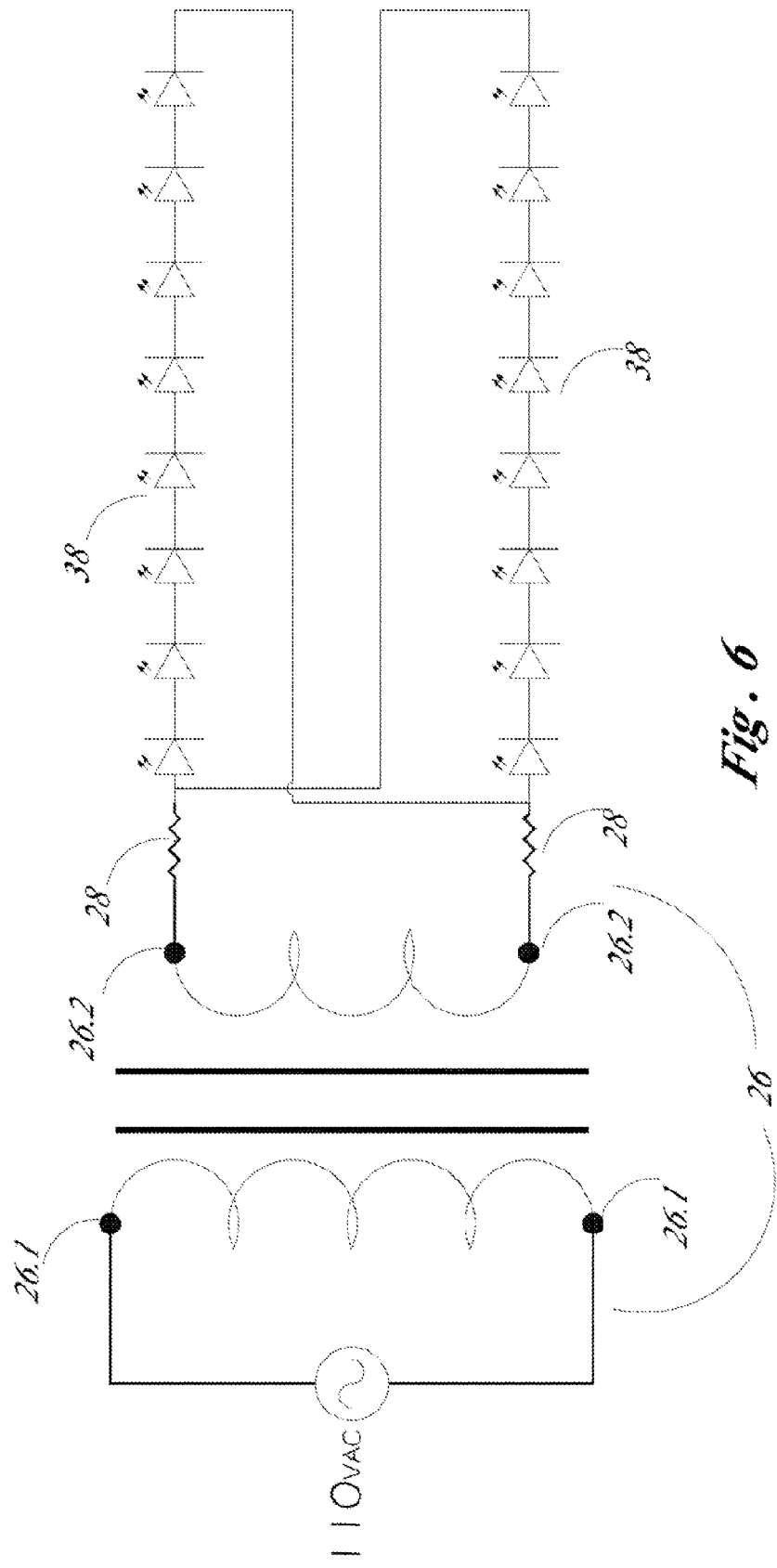
FIG. 6 is a schematic diagram of an exemplary AC LED assembly.

FIG. 6 is a schematic diagram of an exemplary AC LED assembly. In FIG. 6, two sets of LED strings 38 are wired with opposite polarity so that they are powered and produce light in an alternating fashion without the need for an LED driver circuit. Although in exemplary embodiments an LED driver circuit may be used.

Figure 7:
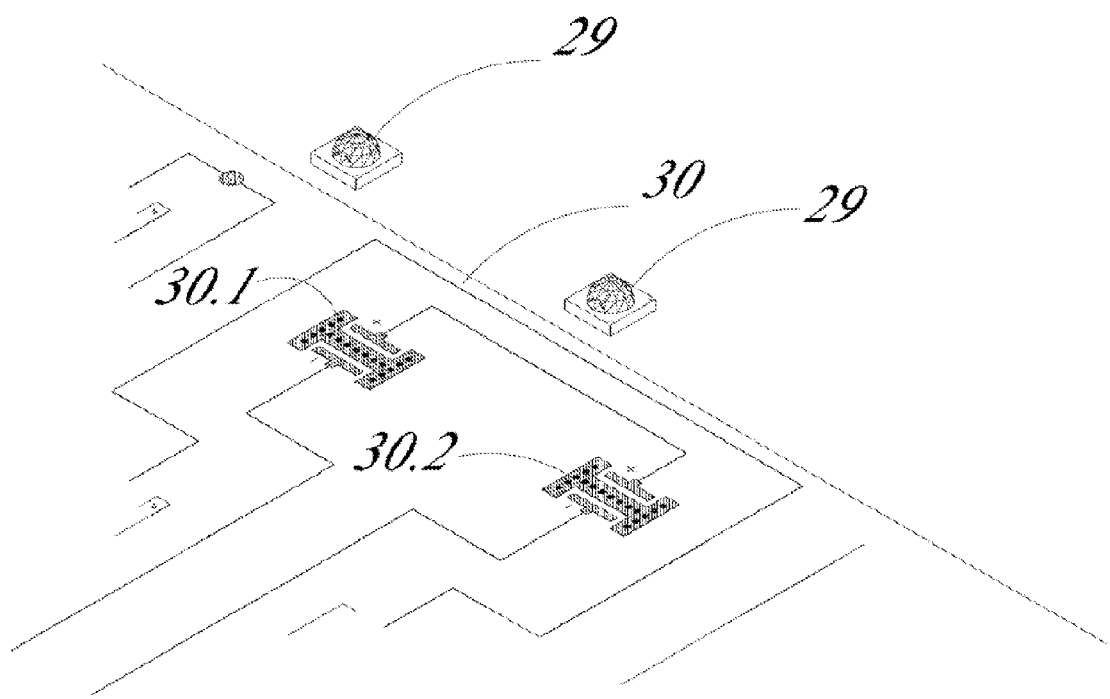
FIG. 7 is a schematic diagram of an exemplary LED mounting structure for use in an LED lighting assembly where a thermal path is made using substantially solid vias.

FIG. 7 is a schematic diagram of an exemplary LED mounting structure for use in an LED lighting assembly. In FIG. 7, LEDs 29 with opposite polarity are mounted on a thermally modified printed circuit board or PCB 30 in pairs so that a pair produces a steady stream of light. In exemplary embodiments, opposing LEDs are spaced at a distance of no more than the diameter of their isolating lens plus an additional distance for ease of manufacture, to prevent or reduce a possible strobe effect. Alternatively, in exemplary embodiments, the lighting may be placed at other distances from each other so long as they are aimed at the same, or substantially the same, surface.

The thermal pads 30.1 upon which the LEDs are mounted are "I" shaped, electrically isolated and have 0.25 mm solid copper vias 30.2 spaced as close together as PCB manufacturing will allow to an identical, or substantially similar, thermal pad on the backside of the PCB. This passive thermal technique helps transfer the heat from the LED 29 die solder junction to the back of the PCB 30. LEDs 29 may be attached to the PCB 30 using the reflow method specified by the LED manufacturer and/or an electrical and thermal conductive epoxy.

FIG. 8 is a schematic diagram of an AC LED lighting assembly with an exemplary active heat management system for use in an LED lighting assembly. The active heat management system draws away the passively transferred waste heat at the backside of the PCB 30 and converts it into electrical energy. In the exemplary embodiment of FIG. 8, the PCB 30 may be mechanically attached to the primary heat-sink plate 13 that is shaped to match the thermal pads 30.1 of the LEDs 29 so as not to allow heat to dissipate across the backside of the PCB 30. The thermal connection of the pad to plate is enhanced by the use of thermal adhesive. In exemplary embodiments, the transformer 26 may be mechanically attached to the primary heat-sink plate 13 but isolated from the PCB 30 by dropping it below the Isolation Wall 18. The thermal connection of the Transformer 26 to plate is enhanced by the use of thermal adhesive.

In exemplary embodiments, the resistors 28 may be mechanically attached to the primary heat-sink plate 13 using a resistor clamp 27 and is also sufficiently isolated from the PCB 30 by dropping it below the isolation wall 18. The thermal connection of the resistors 28 and the resistor clamp 27 to plate is enhanced by the use of thermal adhesive.

In exemplary embodiments, a heat-sink stack of thermally conductive substrate 13 matching the thermal pads 30.1 of the LEDs 29 may be attached by compression to the primary thermally conductive substrate 13. The thermal connection of the primary thermally conductive substrate 13 to stack is enhanced by the use of thermal adhesive.

In exemplary embodiments, an isolation wall 18 that houses thermoelectric device 22 with their "hot side" facing the heat-sink stack 13 may be attached by compression to the heat-sink stack 13. The thermal connection of the stack to the thermoelectric device 22 may be enhanced by the use of thermal adhesive.

In exemplary embodiments, the thermoelectric device 10 may receive most of the waste heat generated by the LEDs 29, the transformer 26 and the resistors 28 as described herein and are configured in series, parallel or a mix of both to define the output to the desired configuration of the electrical power (volts and amps) they generate from the waste heat. These configurations of the thermoelectric devices 10 would be readily understood by a person of ordinary skill in the art. Additional thermoelectric devices may also be stacked behind the thermoelectric device 10 shown to transfer heat in stages to produce additional power and move the heat further from the PCB 30.

Figure 9:
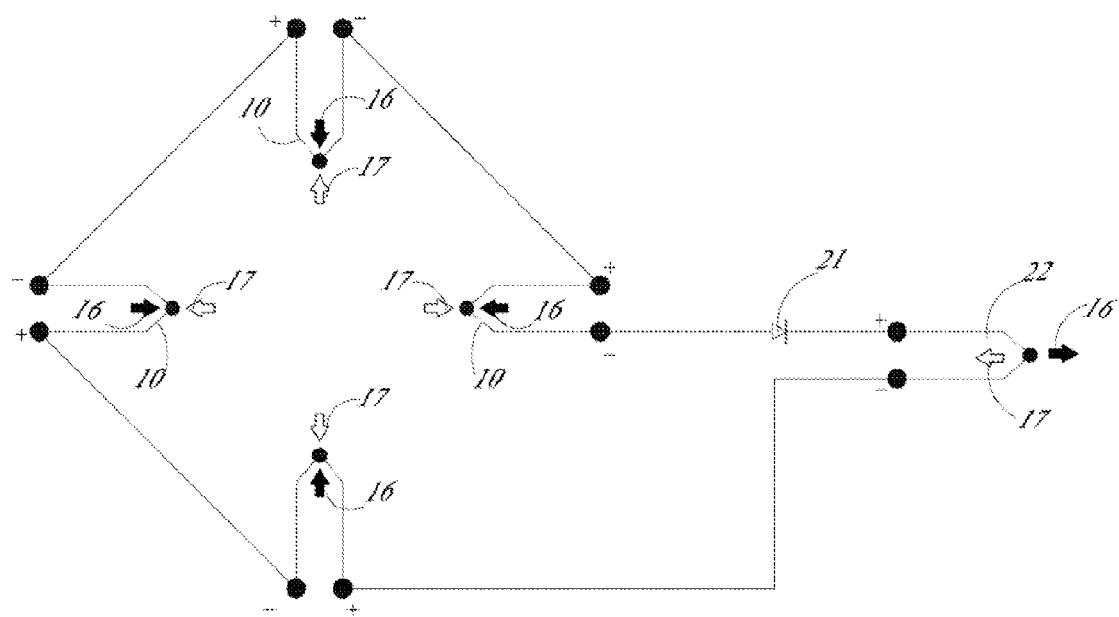
FIG. 9 is a schematic diagram of an exemplary DC circuit for use in an LED lighting assembly for harvesting thermal energy from four local heat sources, converting the thermal energy to electrical energy using thermoelectric generators (in series), to power a thermoelectric chiller.

In exemplary embodiments, a phase change material packet ring 15 may be chilled by thermoelectric devices 22 that are powered by the reclaimed energy from wasted heat to maximize the cooling. The thermoelectric devices 22 become thermoelectric chillers when DC power is applied in reverse polarity. A blocking diode maintains the chilling effect by not allowing (or reducing the likelihood) the thermoelectric devices 22 to become thermoelectric heaters. The phase change material packet 15 material may have a target temperature of 20° C. In exemplary embodiments, this secondary DC power source would add substantially less, little or no additional power consumption for the LEDs, as it is reclaimed by energy that would typically go wasted. This configuration is illustrated in FIG. 9 which is a schematic diagram of an exemplary DC circuit for use in actively cooling an LED lighting assembly.

The lens used in most LED fixtures cause interference and diminish the lumen output due to interference of the light generated by one LED with the ability of adjacent LEDs to operate at optimal efficiency ("LED to LED interference"). In general, LED to LED interference comes in two forms. First, the reflection of light generated by one LED off the lens of another LED causes optical interference. This optical interference diminishes the efficiency of the LED luminary fixture. Second, the absorption of light generated by an LED by adjacent LEDs creates a small photovoltaic effect resulting in a reverse voltage in the circuit interfering with the effectiveness of the power deployed to run the LED.

To mitigate the described interference, exemplary embodiments may use individual lenses with isolation housing or reflectors to stop, or substantially reduce, the path of light from one LED to another and the negative effect thereof. In exemplary embodiments, the lenses may also tighten up the beam angle to the desired spread. In exemplary embodiments, the desired spread may be determined based on the entire array and not the individual LEDs.

In cases where a lens is utilized rather than a reflector an index matched gel may also be utilized at the juncture point of the Lens and the LED dome to reduce loss caused by refraction at the juncture point. An exemplary optical adhesive is NOA 88. In general, the adhesive may have various combinations of properties similar to one or more of those detailed below in Table 1:

TABLE 1

| Exemplary Optical Adhesive Properties | |
|---|---|
| Solids | 100% |
| Viscosity at 25° C. | 200 cps (e.g., 200-5,000 cps, 500 cps, 1000 cps, 1000-2000 cps, 200-300 cps, 200-400 cps, 150-250 cps, etc) |
| Refractive Index of Monomer | 1.52 (e.g., 1.50, 1.51, 1.52, 1.53, 1.54 etc.) |
| Refractive Index of Cured Polymer | 1.56 (e.g., 1.51-1.58, 1.51, 1.52, 1.53, 1.54, 1.55, 1.56, 1.57, 1.58, etc.) |
| Elongation at Failure | 41% (e.g., 18-80%, 25%, 30%, 40%, 50%, 60%, 70%, 75%, etc.) |
| Modulus of Elasticity (psi) | 131,000(e.g., 131,000-150,000, 135,000, 140,000, 145,000, 150,000, etc.) |
| Tensile Strength (psi) | 2,000 (e.g., 101-2800, 500, 750, 1000, 1250, 1500, 1750, 1900, 2100, 2500, 2700, 2800, etc.) |
| Hardness - Shore D | 90 (e.g., 25-90, 25, 30, 40, 45, 50, 60, 70, 75, 80, 90, etc.) |
| Total Mass Loss (TML) | 1.07% |
| Collected Volatile Condensable Material (CVCM) | <0.01% |
| Dielectric Constant (1 MHz) | 4.06 |
| Dielectric Strength (V/mil) | 457 |
| Dissipation Factor (1 MHz) | 0.0341 |
| Volume Resistivity (ohm-cm) | $6.85 \times 10^{14}$ |
| Surface Resistivity (MEgohms) | $3.71 \times 10^{12}$ |

Figure 10:
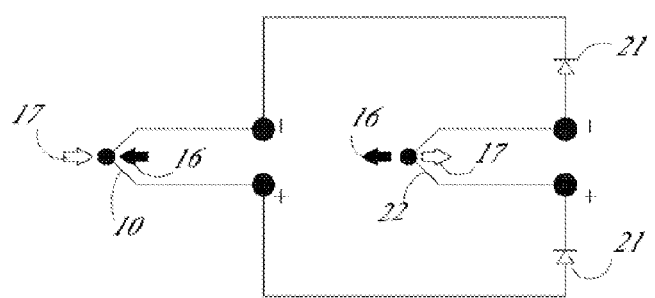
FIG. 10 is a schematic diagram of an exemplary DC circuit for harvesting thermal energy from one local heat source in an LED lighting assembly and converting the thermal energy to electrical energy using a thermoelectric generator to power a thermoelectric chiller.

FIG. 10 is a schematic diagram of an exemplary DC circuit for use in actively cooling an LED lighting assembly. In FIG. 10, a single thermoelectric generator 10 receives the wasted heat from a source, e.g., an LED, heat of the sun on the fixture case, etc. on one side described as the high temperature flow 17 and receives a cooler temperature on its opposite side from a source, e.g. cooler ambient temperature, a low temperature phase change material or a condensation line, etc. described as a low temperature flow 16. The circuit generates direct current electrical energy that flows through a blocking diode 21 placed as a protection device to ensure a single direction of electrical flow to a single thermoelectric chiller 22. The thermoelectric chiller 22 receives the electrical energy and pumps away heat from one side causing a low temperature flow 16 from one side and a high temperature flow 17 on the other. Another Blocking Diode 21 may be placed after the thermoelectric chiller 22 before closing the circuit back at the thermoelectric generator 10.

Figure 11:
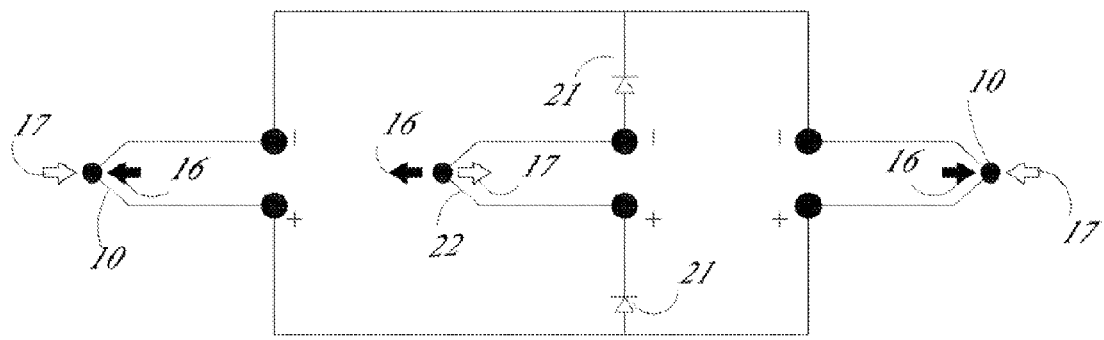
FIG. 11 is a schematic diagram of an exemplary DC circuit for harvesting thermal energy from two local heat sources in an LED lighting assembly and converting the thermal energy to electrical energy using two thermoelectric generators, in parallel, to power a thermoelectric chiller.

FIG. 11 is a schematic diagram of an exemplary DC circuit for use in actively cooling an LED lighting assembly.

In FIG. 11, multiple thermoelectric generators 10 receive the wasted heat from multiple sources, e.g., an LED, heat of the sun on the fixture case, etc. on one side described as the high temperature flow 17 and receive cooler temperature on their opposite side from multiple sources, e.g. cooler ambient temperature, a low temperature phase change material or a condensation line, etc. described as a low temperature flow 16. The circuit generates multiple sources of direct current electrical energy connected together in parallel that flow through a blocking diode 21 placed as a protection device to ensure a single direction of electrical flow to a thermoelectric chiller 22 that receives the electrical energy and pumps away heat from one side causing a Low Temperature Flow 16 from one side and a high temperature flow 17 on the other. Another blocking diode 21 may be placed after the thermoelectric chiller 22 before closing the circuit back at the thermoelectric generators 10.

Figure 12:
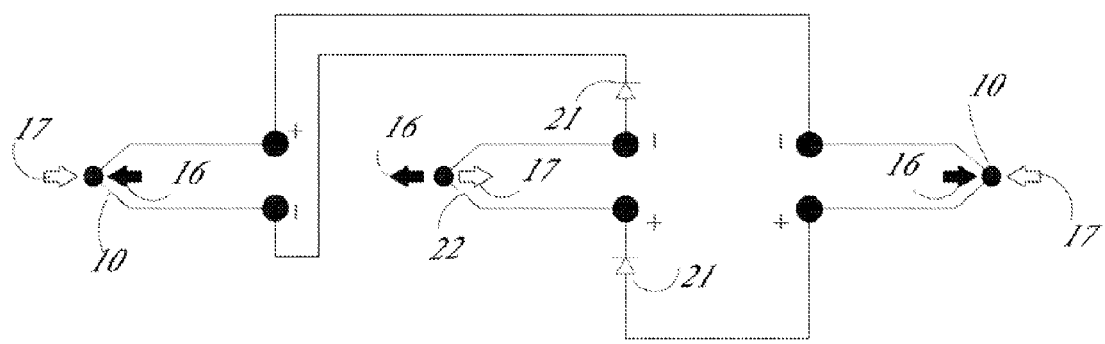
FIG. 12 is a schematic diagram of an exemplary DC circuit for harvesting thermal energy from two local heat sources in an LED lighting assembly and converting the thermal energy to electrical energy using two thermoelectric generators, in series, to power a thermoelectric chiller.

FIG. 12 is a schematic diagram of an exemplary DC circuit for use in actively cooling an LED lighting assembly, where multiple thermoelectric generators 10 receive the wasted heat from multiple sources, e.g., an led, heat of the sun on the fixture case, etc. on one side described as the high temperature flow 17 and receive cooler temperature on their opposite side from multiple sources, e.g. cooler ambient temperature, a low temperature phase change material or a condensation line, etc. described as a low temperature flow 16. The circuit generates multiple sources of direct current electrical energy connected together in series that flow through a blocking diode 21 placed as a protection device to ensure a single direction of electrical flow to a thermoelectric chiller 22 that receives the electrical energy and pumps away heat from one side causing a low temperature flow 16 from one side and a high temperature flow 17 on the other. Another blocking diode 21 may be placed after the thermoelectric chiller 22 before closing the circuit back at the thermoelectric generators 10.

Figure 13:
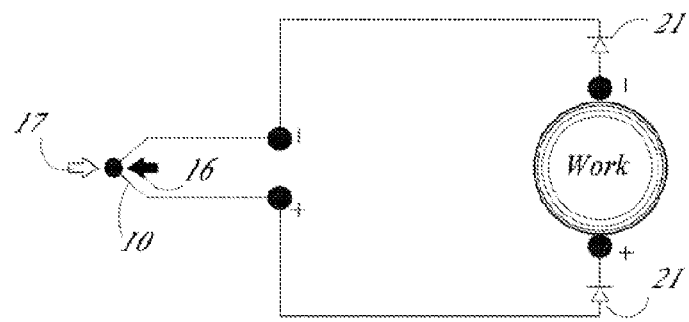
FIG. 13 is a schematic diagram of an exemplary DC circuit for harvesting thermal energy from one local heat source in an LED lighting assembly and converting the thermal energy to electrical energy using a thermoelectric generator to power another local device, e.g., a camera, a timer or a sensor etc.

FIG. 13 is a schematic diagram of an exemplary DC circuit for use in actively cooling an LED lighting assembly and harvesting that thermal energy and converting it back into electrical energy. In FIG. 13, a single thermoelectric generator 10 receives the wasted heat the LED or LEDs on one side described as the high temperature flow 17 and receives a cooler temperature on the opposite side from a source, e.g. cooler ambient temperature, a low temperature phase change material or a condensation line, etc. described as a low temperature flow 16. The circuit generates direct current electrical energy that flows through a blocking diode 21 placed as a protection device to ensure a single direction of electrical flow to any type of electrical device capable of using the power provided shown as "work." Another blocking diode 21 may be placed after the thermoelectric chiller 22 before closing the circuit back at the thermoelectric generator 10.

Figure 14:
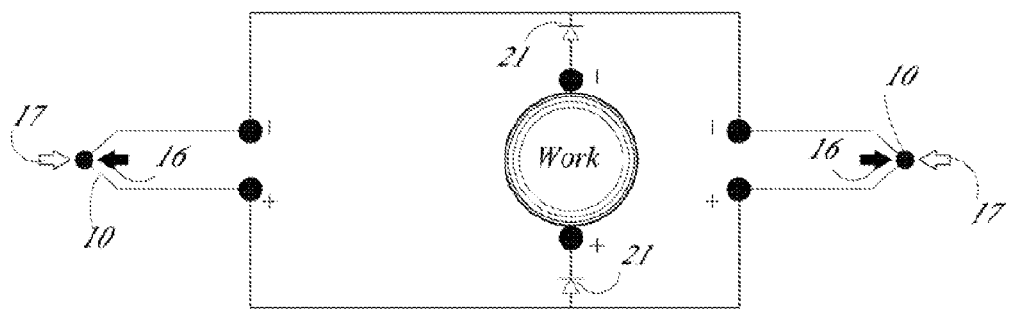
FIG. 14 is a schematic diagram of an exemplary DC circuit for harvesting thermal energy from two local heat sources in an LED lighting assembly and converting the thermal energy to electrical energy using two thermoelectric generators, in parallel, to power another local device, e.g., a camera, a timer or a sensor, etc.

FIG. 14 is a schematic diagram of an exemplary DC circuit for use in actively cooling an LED lighting assembly and harvesting that thermal energy and converting it back into electrical energy. In FIG. 14, multiple thermoelectric generators 10 receive the wasted heat from multiple sources, e.g., the LEDs, heat of the sun on the fixture case, etc. on one side described as the high temperature flow 17 and receive cooler temperature on their opposite side from multiple sources, e.g. cooler ambient temperature, a low temperature phase change material or a condensation line, etc. described as a low temperature flow 16. The circuit generates multiple sources of direct current electrical energy connected together in parallel that flow through a blocking diode 21 placed as a protection device to ensure a single direction of electrical flow to various types of electrical devices capable of using the power provided shown as "work." Another blocking diode 21 may be placed after the thermoelectric chiller 22 before closing the circuit back at the thermoelectric generator 10.

Figure 15:
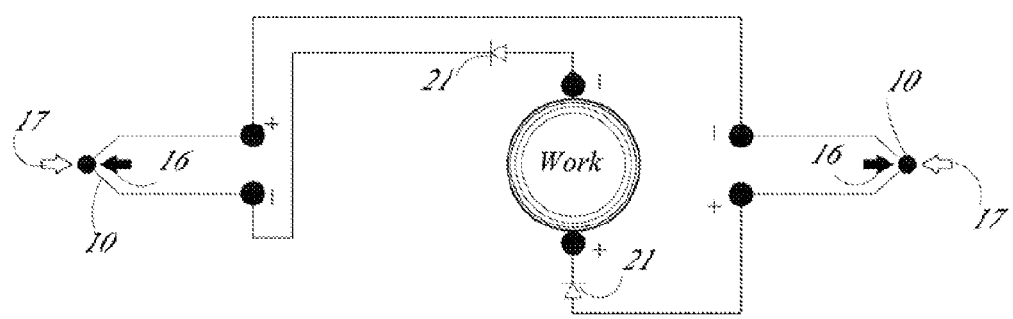
FIG. 15 is a schematic diagram of an exemplary DC circuit for harvesting thermal energy from two local heat sources in an LED lighting assembly and converting the thermal energy to electrical energy using two thermoelectric generators, in series, to power another local device, e.g., a camera, a timer or a sensor.

FIG. 15 is a schematic diagram of an exemplary DC circuit for use in actively cooling an LED lighting assembly and harvesting that thermal energy and converting it back into electrical energy. In FIG. 15, multiple thermoelectric generators 10 receive the wasted heat from multiple sources, e.g., the LEDs, heat of the sun on the fixture case, etc. on one side described as the high temperature flow 17 and receive cooler temperature on their opposite side from multiple sources, e.g. cooler ambient temperature, a low temperature phase change material or a condensation line, etc. described as a low temperature flow 16. The circuit generates multiple sources of direct current electrical energy connected together in series that flow through a blocking diode 21 placed as a protection device to ensure a single direction of electrical flow to various types of electrical devices capable of using the power provided shown as "work." Another blocking diode 21 may be placed after the thermoelectric chiller 22 before closing the circuit back at the thermoelectric generator 10.

Figure 16:
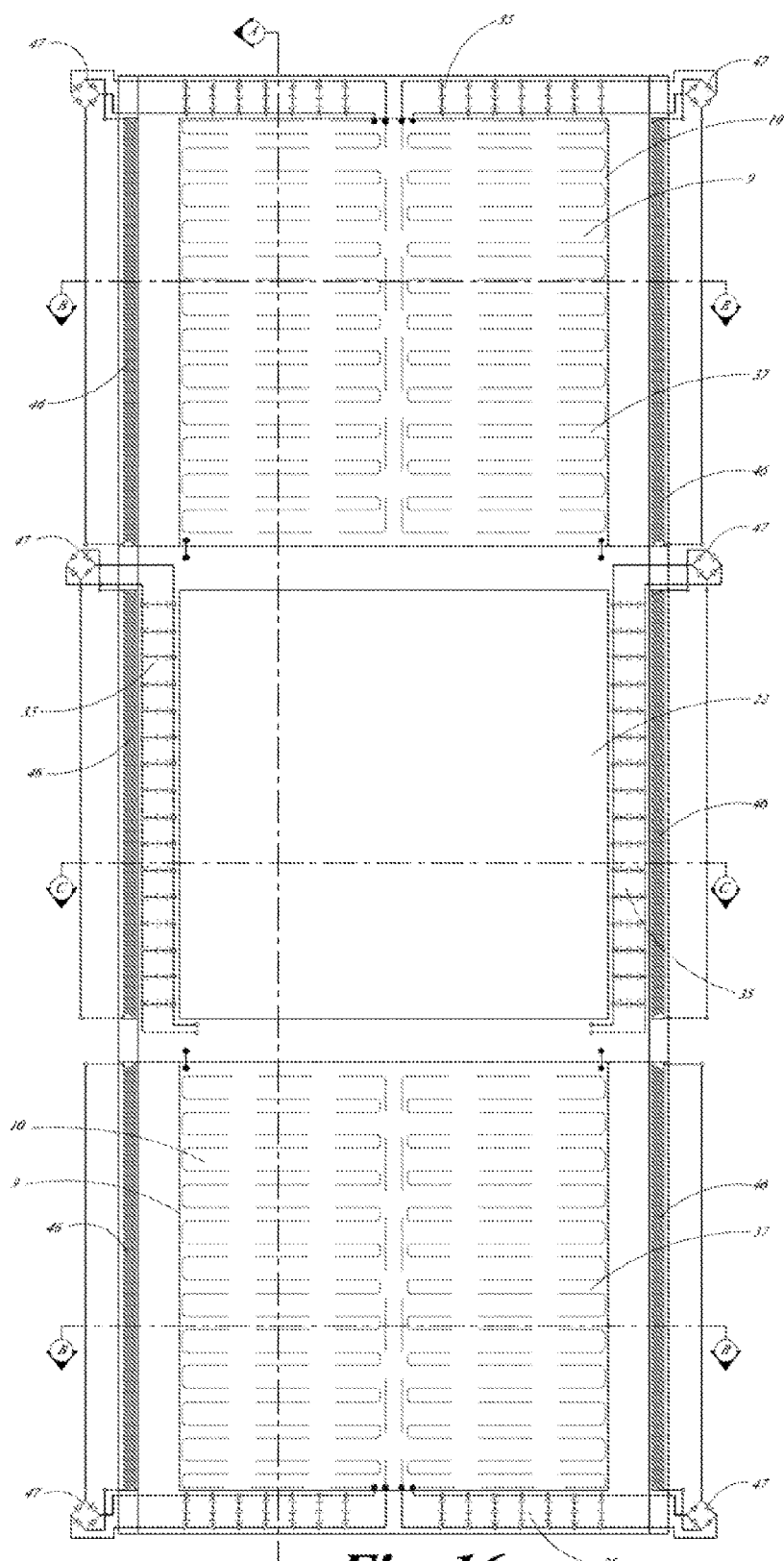
FIG. 16 is a schematic diagram of an exemplary embodiment of an electromagnetic and thermal energy harvesting power supply for use in e.g., an LED lighting assembly.
Figure 17:
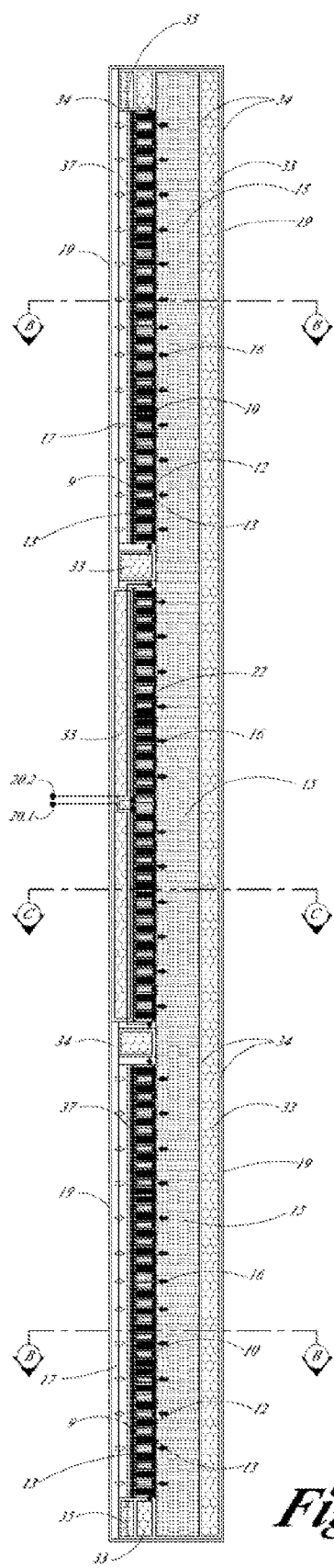
FIG. 17 is a schematic diagram of an exemplary embodiment of cross-section A of the exemplary power supply of FIG. 16 for use in an LED lighting assembly.
Figure 18:
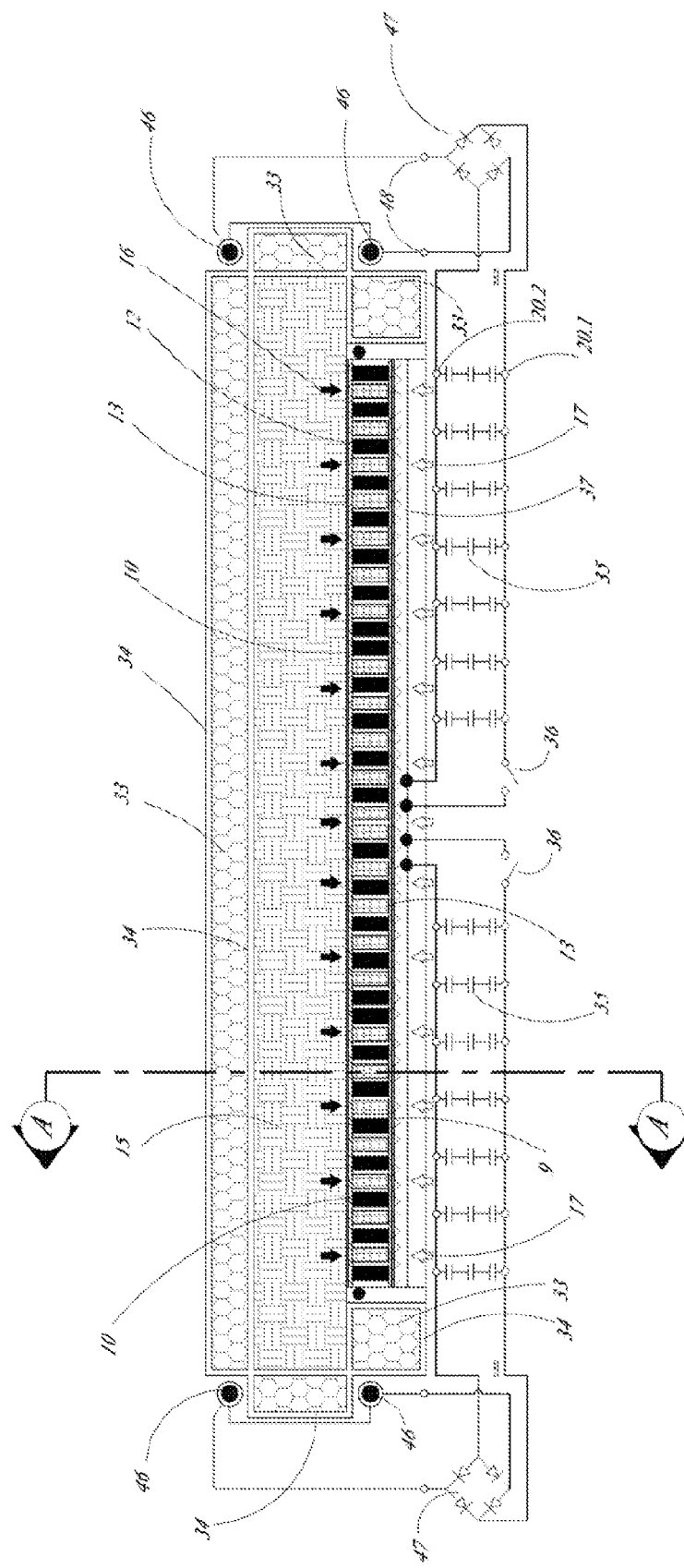
FIG. 18 is a schematic diagram of an exemplary embodiment of cross-section B of the exemplary power supply of FIG. 16 for use in an LED lighting assembly.
Figure 19:
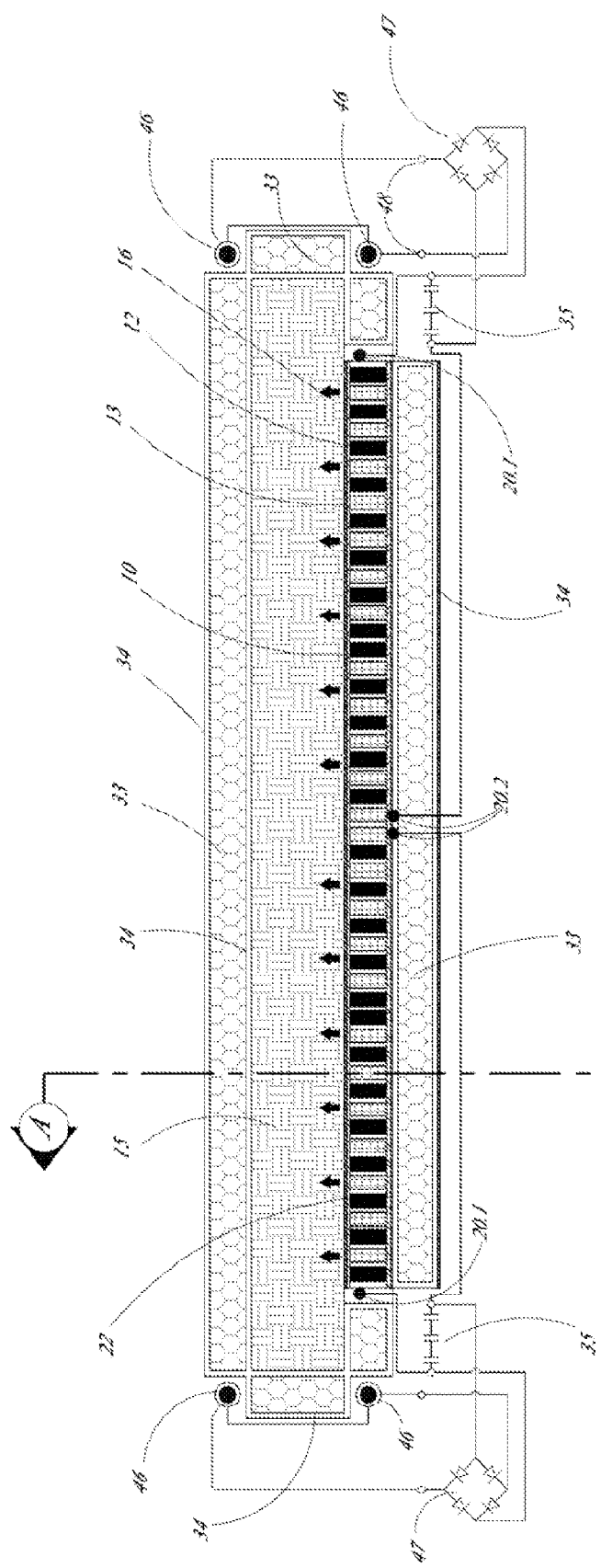
FIG. 19 is a schematic diagram of an exemplary embodiment of cross-section C of the exemplary power supply of FIG. 16 for use in an LED lighting assembly.

FIG. 16 is a schematic diagram of an exemplary embodiment of an electromagnetic and thermal energy harvesting power supply for use in e.g., an LED lighting assembly. FIG. 17 is a schematic diagram of an exemplary embodiment of cross-section A of the exemplary power supply of FIG. 16 for use in an LED lighting assembly. FIG. 18 is a schematic diagram of an exemplary embodiment of cross-section B of the exemplary power supply of FIG. 16 for use in an LED lighting assembly. FIG. 19 is a schematic diagram of an exemplary embodiment of cross-section C of the exemplary power supply of FIG. 16 for use in an LED lighting assembly.

Referring to FIG. 16, a schematic diagram of an exemplary embodiment of a an electromagnetic and thermal energy harvesting power supply for use in a device of choice (e.g., an LED lighting assembly) is shown. In exemplary embodiments, the power supply may be used to power any device so long as the input power requirement of the device matches the output power of the described power supply. In exemplary embodiments ambient electromagnetic radiation may be harvested using a series of enameled (or otherwise insulated) wire coil around an electrically conductive shaft (e.g., cylindrical ferrite cores 46) of differing sizes and wraps to match multiple frequencies in order to harvest energy at multiple wavelengths and frequencies where it is then converted to direct current using blocking diodes in a rectifying circuit 47 and used to fill ultra capacitor arrays 35 designed for an output power matching the input of thermoelectric chillers 22 and Nichrome coil heat elements 37. In exemplary embodiments, the coil may be implemented without a conductive shaft. The electromagnetic harvesting may be constant, if desired, regardless of whether the device of choice is being operated. The Nichrome coil heat elements 37 are in contact with the thermoelectric device substrate (hot side) 9 of thermoelectric generators 10. The thermoelectric chillers 22 are in contact with low temperature phase change material 15 as shown in FIG. 17 which is a vertical cross section schematic diagram of FIG. 16. and FIGS. 18 and 19 which are horizontal cross section schematic diagrams of FIG. 16, keeping the thermoelectric device at a calculated constant temperature. Now referring to FIGS. 17, 18 and 19 the thermoelectric device substrate (cold side) 12 of the thermoelectric generators 10 is in contact with the low temperature phase change material 15. the thermoelectric device substrate (hot side) 9 of thermoelectric generators 10 are in contact with the Nichrome coil heat elements 37 which cause a thermal difference between both sides of the thermoelectric generators 10 which converts the thermal energy into a calculable electrical energy that is capable in powering the device of choice. During times when the electrical device is in operation, the waste heat from one or more components may be routed to the thermoelectric device substrate (hot side) 9 of thermoelectric generators 10 to provide passive cooling to those components and harvest the thermal energy. During times when the electrical device is not in operation, ambient temperature and the low temperature phase change material 15 cause a calculable thermal difference between both sides of the thermoelectric generators 10 which converts the thermal energy into a calculable electrical energy that is capable of powering the thermoelectric chillers 22 for the chilling of low temperature phase change material 15. The low temperature phase change material 15 is in contact with the thermoelectric generator's 10 and thermoelectric chiller's 22 low thermoelectric device substrate (cold side) 12. All other areas of the low temperature phase change material 15, are insulated with e.g., low temperature phase change pellet insulation 33 separated with polypropylene case walls 34. The entire power supply is then sealed in outer material of choice e.g., fiber glass, plastic or metal.

Figure 20:
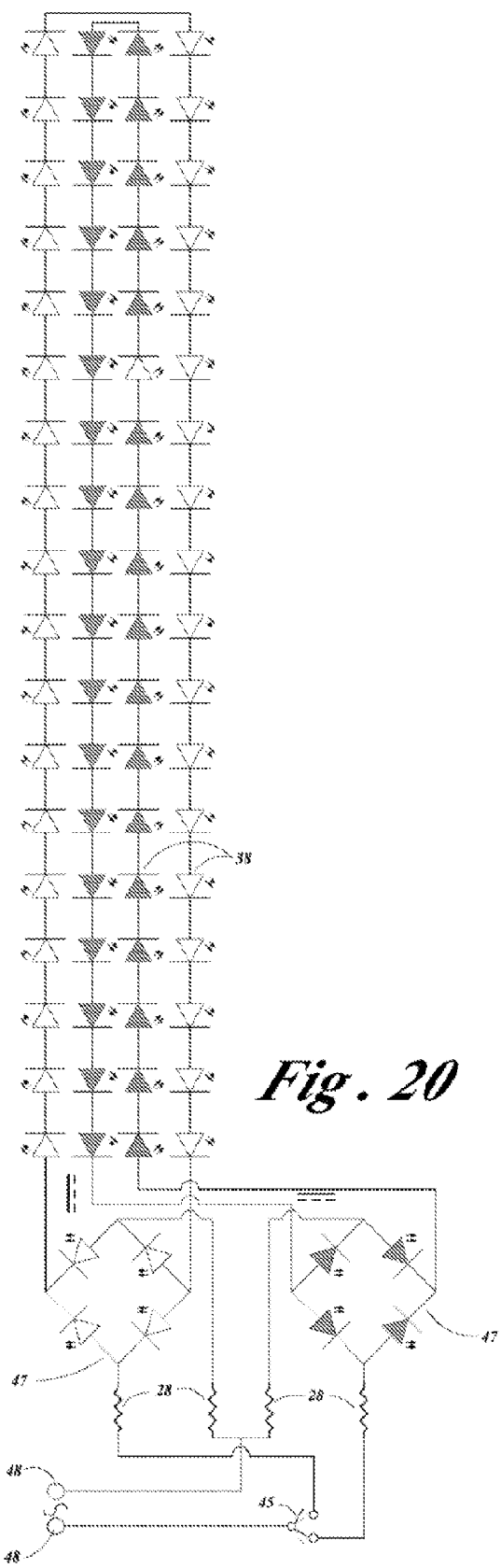
FIG. 20 is a schematic diagram of an exemplary AC LED assembly which uses the first 4 LEDs in the string to rectify the AC power without requiring the use of additional components.

FIG. 20 is a schematic diagram of an exemplary AC LED assembly which uses the first 4 LEDs in the string to rectify the AC signal without requiring the use of additional components. In FIG. 20, an electrical schematic, two separate LED strings 38, of differing color temperatures and color rendering indexes are set in series (positive to negative), in order to add up to the voltage of the input voltage. To calculate this the input voltage is divided by the desired forward voltage of the individual LEDs. A fraction can be rounded down with resistance added using an Inline Resistor 28 to make up the fraction or if the number of LEDs is large enough, rounded up to add an additional LED to the LED strings 38. Both LED strings 38 are started with four L.E.D.'s set in a pattern commonly known in the electrical industry as a rectifying circuit 47. This can be done as long as the maximum reverse current specified by the L.E.D. manufacturer is not exceeded. On one leg of the input of the LED strings 38, before the rectifying circuit 47 a resident memory switch chip 45 is added to allow the control of which of the LED strings 38 is active. A resident memory switch chip 45 is a semiconductor switch manufactured by e.g., Texas Instruments that "remembers" the position of the switch unless a user fast double switches the power switch, in which case the resident memory switch chip 45 changes position and "remembers" it's new position until fast double switched again. In this way a single fixture can have multiple color temperatures and color rendering indexes.

Figure 21:
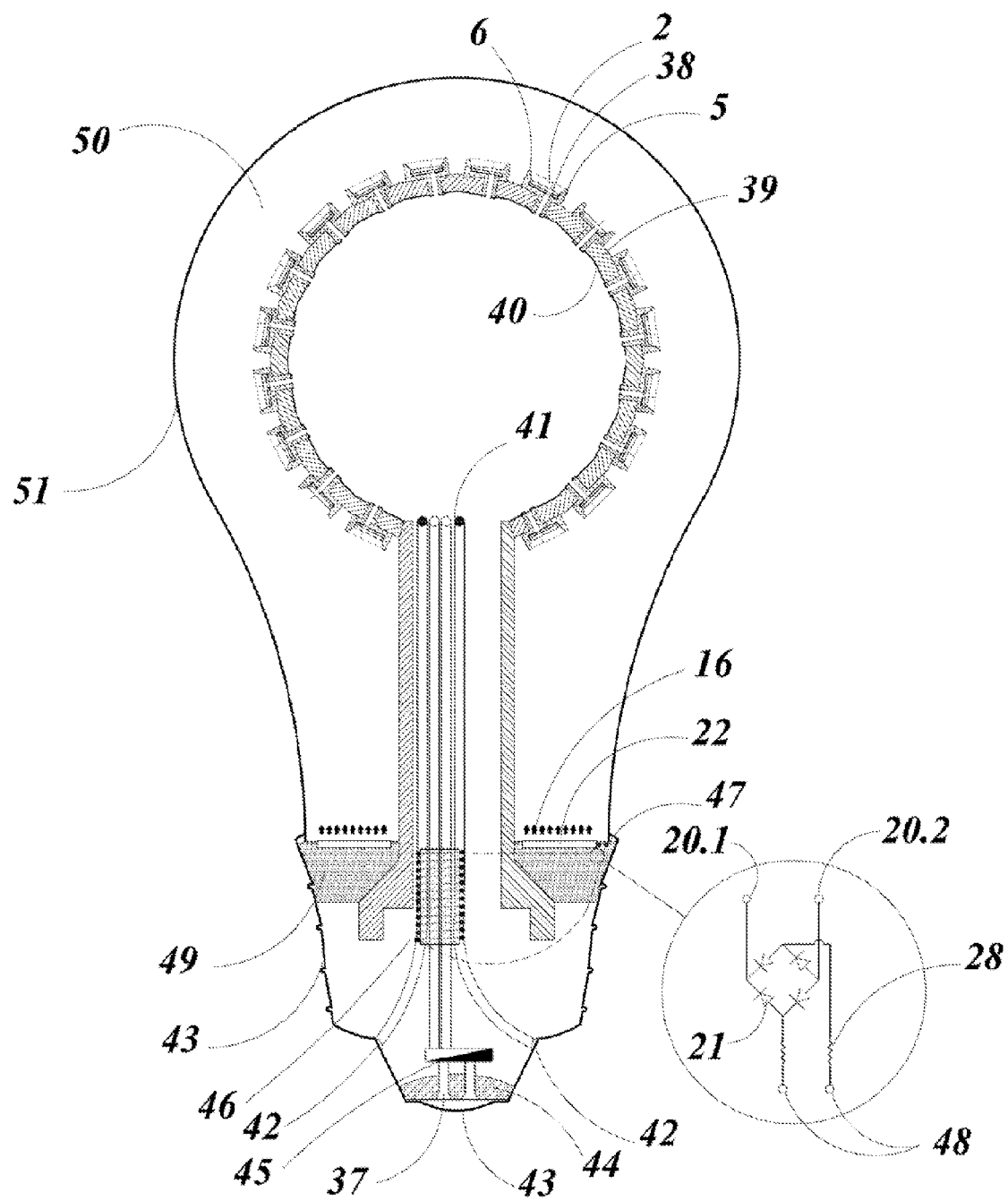
FIG. 21 is a schematic diagram of an exemplary embodiment of an LED lighting assembly.

FIG. 21 is a schematic diagram of an exemplary embodiment of an LED lighting assembly. Referring to FIG. 21, a detailed section of a light bulb embodiment of the invention, invented to replace the popular but highly inefficient incandescent bulb, with two color temperatures and two color rendering indexes controlled by a resident memory switch chip 45 added after the glass fuse enclosure 44 to one leg of the LED strings 38 allowing the control of which of the LED strings 38 is active. The LED strings 38 are electrically wired according to FIG. 20 to accept A/C current without the need of transformers or secondary rectifying circuitry. The individual LEDs of the LED strings 38 are kept clear of negative changes to their lenses refractive index and from negative photovoltaic effects due to other LEDs in the LED strings 38 shining upon them by the aid of an individual optic separator—reflector 2 half of which is attached to the LED cathode 6 and the other half connected to the LED anode 5. The LED strings 38 cathodes 6 and anodes 5 are clipped into holes in a ceramic geodesic substrate and shaft 39 superstructure making contact with a copper foil circuit layer 40 on the ceramic geodesic substrate and shaft's 39 back side. The copper foil circuit layer 40 is electrically attached to enameled connecting wires 41 that electrically attach to the standard bulb screw cap 43 interior with connecting wire contacts 42. Fuse protection is added in a typical bulb industry standard glass fuse enclosure 44. In order to keep the bulb atmosphere's 50 ambient temperature cool a separate direct current circuit is required to run thermoelectric chillers 22. This is achieved by placing an enameled wire coil around cylindrical ferrite core 42 around the enameled connecting wires 37 which will receive a fraction of the electrical power running through the enameled connecting wires 37 when power is on. Both ends of the enameled wire coil around cylindrical ferrite core 46 are connected to a rectifying circuit's 47 AC connectors 44 through an inline resistor 45 on each leg and through or around blocking diodes 46 that changes the electrical flow from AC to DC. The thermoelectric chillers 48 are connected to the direct current flow positive lead 20.1 and the direct current flow negative lead 20.2 of the rectifying circuit 47 with the cold side, when powered, facing into the bulb atmosphere 50 and the hot side, when powered embedded in ceramic filler 50. The upper outer shell of the light bulb is a cellulose triacetate diffuser bulb 51 shaped to match the incandescent bulb it is replacing and made in two halves and heat welded together in order to fit around the ceramic geodesic substrate and shaft 39 superstructure and attached to a standard bulb screw cap 43.

Figure 22:
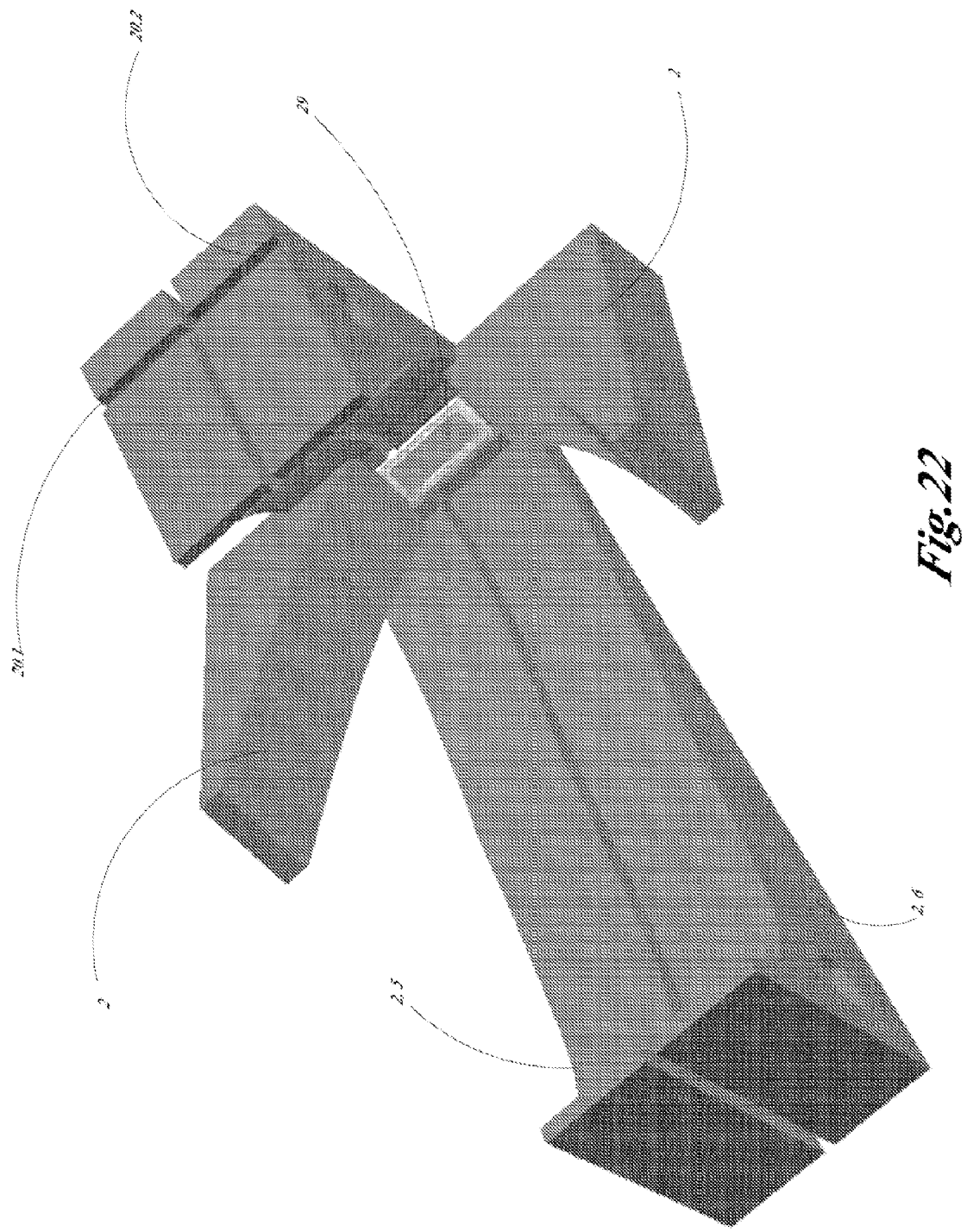
FIG. 22 is a schematic diagram of an exemplary embodiment of an LED lighting assembly for use in e.g., a refrigerator room/case.

FIG. 22 is a schematic diagram of an exemplary embodiment of an LED lighting assembly for use in e.g., a refrigerator room/case. In FIG. 22, an LED 29 is attached to a pair of optic separators—reflectors 2 using electrical and thermally conductive epoxy. One is directly attached to the LED Anode 5 the other to the LED cathode 6. the optic separators—reflectors 2 are connected to the power supply, LED anode 5 to the positive lead 20.1 and LED cathode 6 to the negative lead 20.2. The waste heat produced by the LED 29 is transferred to the optic separators—reflectors 2 preventing, or substantially reducing, them to be effected by condensation that normally requires a secondary casing to alleviate.

In the exemplary embodiment described herein, The following reference numerals have the identified label/structure/operation:

1) Individual Optic (lens or reflector)
2) Optic Separator—Reflector
3) L.E.D. Lens
4) L.E.D. Die
5) L.E.D. Anode (+)
6) L.E.D. Cathode (−)
7) Circuit Layer
8) Electrical and Thermal Conductive Epoxy
9) Thermoelectric Device Substrate (hot side)
10) Thermoelectric Generator
11) L.E.D. Power Supply Connector
12) Thermoelectric Device Substrate (cold side)
13) Thermally Conductive Substrate
14) Thermally Conductive Vertical Path Walls
15) Low Temperature Phase Change Material Storage
16) Low Temperature Flow 17) High Temperature Flow
18) Insulating Barrier
19) Outer Housing
20) Direct Current Flow
20.1 Positive lead
20.2 Negative lead
21) Blocking Diode
22) Thermoelectric Chiller
23) Thermally Conductive Link
24) Sintered Heat Pipe
25) Working Fluid
26) A/C Transformer
26.1 Primary Leads
26.2 Secondary Leads
27) Resistor Clamp
28) Inline Resistor
29) L.E.D.
30) Thermally Modified P.C.B.
30.1 Electrically Isolated Thermal Pad
30.2 Solid Copper Vias
31) Screw
32) Nut
33) Low Temperature Phase Change Pellet Insulation
34) Polypropylene Case Walls
35) Ultra Capacitor Array
36) Bimetallic Strip Switch
37) Nichrome Coil Heat Element
38) L.E.D. Strings
39) Ceramic Geodesic Substrate and Shaft
40) Copper Foil Circuit Layer
41) Enameled Connecting Wire
42) Connecting Wire Contact
43) Standard Bulb Screw Cap
44) Glass Fuse Enclosure
45) Resident Memory Switch Chip
46) Enameled Wire Coil Around Cylindrical Ferrite Core
47) Rectifying Circuit
48) A/C Connectors
49) Ceramic Filler
50) Bulb Atmosphere
51) Cellulose Triacetate Diffuser Bulb.

EXAMPLES

A lighting device comprising: a plurality of LEDs; a plurality of optic devices corresponding to the plurality of LEDs; at least one optical separator for substantially preventing the light emitted from one LED from effecting the other LEDs; a thermoelectric device configured to harvest heat generated by the LEDs and convert the harvested heat into electrical energy; and a low temperature material for creating a temperature difference across the thermoelectric device.

The lighting device may comprise at least one optical separator that substantially prevents a change in refractive index of the other lights.

The lighting device may comprise at least one optical separator that substantially prevents a photovoltaic effect on the other lights.

The lighting device may comprise a low temperature material that is a phase change material.

The lighting device may generate electrical energy that is used to aid in maintaining the low temperature material at a low temperature.

The lighting device the generated electrical energy is used to aid in powering at least one additional LED.

The lighting device may be powered by DC voltage.

The DC power may be harvested from the site where the light is needed, e.g., waste thermal energy from a water line or other local process, radio waves, sunlight, etc.

The lighting device may be supplied with AC voltage and a plurality of LEDs may be arranged such that about 50% are in a first polarity and about 50% are in a reverse polarity.

The power source may be designed to supply about 2.78V and about 80 mA.

The power supply may be a substantial power match to the LED specifications.

Matching the power supply may benefit the lighting device by increasing the output by +72.57 lm/w (e.g., 20 lm/w, 30 lm/w, 40 lm/w, 50 lm/w, 60 lm/w, 70 lm/w, 75 lm/w, 80 lm/w, 90 lm/w, etc.).

Matching the power supply may result in a lifecycle gain of about 600% (e.g., 50%, 100%, 200%, 300%, 400%, 500%, 700%, 800%).

The LEDs in the lighting device may be mounted on the TEG substrate using conductive paste: +/−0 lm/w—Lifecycle loss 0% (e.g., substantially no lifecycle loss).

An active thermal design of the lighting device to remove/reduce ambient heat may result in an increase in output of about +8 lm/w (e.g., 4 lm/w, 5 lm/w, 6, lm/w, 7 lm/w, 9 lm/w, 10 lm/w, 15 lm/w, etc.) and/or a lifecycle gain of about 100% (e.g., 20%, 30%, 40%, 50%, 60%, 70%, 80%, 90%, 100%, 110%, 120%, 130%, 140%, 150%).

An active thermal design of the lighting device to remove solder junction heat may result in an increase of output by about +5 lm/w (e.g., 4 lm/w, 5 lm/w, 6, lm/w, 7 lm/w, 9 lm/w, 10 lm/w, 15 lm/w, etc.) and/or a lifecycle gain of about 100% (e.g., 20%, 30%, 40%, 50%, 60%, 70%, 80%, 90%, 100%, 110%, 120%, 130%, 140%, 150%).

The harvested thermal energy may be converted back to light which may result in an effective improvement of about +6 lm/w (e.g., 4 lm/w, 5 lm/w, 6, lm/w, 7 lm/w, 9 lm/w, 10 lm/w, 15 lm/w, etc.) and/or a lifecycle gain of about 0% (e.g., substantially no lifecycle loss).

The lighting device may have a lens designed to reduce optical loss from the lens or reflectors which may reduce lens/reflector loss to about −3% lm/w—(e.g., 1 lm/w, 2 lm/w, 3 lm/w, 4 lm/w, 5 lm/w, 6 lm/w, 7 lm/w, etc.) and/or a lifecycle loss of about 0% (e.g., substantially no lifecycle loss).

The lighting device may have an LED Efficacy that is raised from 150 lm/w to 234.32 lm/w (e.g., an improvement of 25%, 30%, 40%, 50%, 55%, 60%, 70%, 75%, 80%, 90%, 100%, etc.).

The lighting device may have an LED Lifecycle: raised from 100,000 hours to 800,000 hours (e.g., 150,000, 200,000, 250,000, 300,000, 350,000, 400,000, 450,000, 500,000, 550,000, 600,000, 650,000, 700,000, 750,000, 800,000, 850,000, 900,000, 1,000,000 hours, etc.) or a life cycle extension of e.g., 100%, 200%, 300%, 400%, 500%, 600%, 700%, etc.

The lighting device may have fewer components than convention device and may cost less to manufacture.

The lighting device may be easier to manufacture and have a smaller BOM;

The lighting device may have heat transfer methods that work in any fixture housings and environments.

Outdoor versions of the lighting device may have fixtures that benefit from harvesting heat from the sun cold thermal energies at night.

The lighting device may have optic design at the individual LED level that improves the percentage of the lumens that reach the intended working surface;

The lighting device may be able to harvest more thermal energy to run another type of sub system, e.g., camera, signal, sensors, etc.

In the description of exemplary embodiments of this disclosure, various features are sometimes grouped together in a single embodiment, figure or description thereof for the purpose of streamlining the disclosure and aiding in the understanding of one or more of the various disclosed aspects. This method of disclosure, however, is not to be interpreted as reflecting an intention that the claimed inventions requires more features than are expressly recited in each claim. Rather, as the following claims reflect, inventive aspects may lie in less than all features of a single foregoing disclosed embodiment.

Thus, the claims following the Detailed Description are hereby expressly incorporated into this Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art.

Although the present disclosure makes particular reference to exemplary embodiments thereof, variations and modifications can be effected within the spirit and scope of the following claims.

What is claimed is:

1. A lighting device comprising:
   a plurality of LEDs;
   a plurality of optic devices corresponding to the plurality of LEDs;
   at least one optical separator for substantially preventing the light emitted from one LED from effecting the other LEDs;
   a thermoelectric device configured to harvest heat generated by the LEDs and convert the harvested heat into electrical energy; and
   a low temperature material for creating a temperature difference across the thermoelectric device;
   wherein the low temperature material is a phase change material.

2. The lighting device of claim 1 wherein the at least one optical separator substantially prevents a change in refractive index of the other lights.

3. The lighting device of claim 1 wherein the at least one optical separator substantially prevents a photovoltaic effect on the other lights.

4. The lighting device of claim 1 wherein the generated electrical energy is used to aid in maintaining the low temperature material at a low temperature.

5. The lighting device of claim 1 wherein the generated electrical energy is used to aid in powering at least one additional LED.

6. The lighting device of claim 1 wherein the lighting device is supplied with DC voltage.

7. The lighting device of claim 1 wherein the lighting device is supplied with AC voltage and the plurality of LEDs are arranged such that about 50% are in a first polarity and about 50% are in a reverse polarity.

8. A lighting device comprising:
   a plurality of LEDs;
   a plurality of optic devices corresponding to the plurality of LEDs;
   at least one optical separator for substantially preventing the light emitted from one LED from effecting the other LEDs;
   a thermoelectric device configured to harvest heat generated by the LEDs and convert the harvested heat into electrical energy; and
   a low temperature material for creating a temperature difference across the thermoelectric device;
   wherein the lighting device is supplied with AC voltage and the plurality of LEDs are arranged such that about 50% are in a first polarity and about 50% are in a reverse polarity.

9. The lighting device of claim 1 wherein the at least one optical separator substantially prevents a change in refractive index of the other lights.

10. The lighting device of claim 1 wherein the at least one optical separator substantially prevents a photovoltaic effect on the other lights.

11. The lighting device of claim 1 wherein the low temperature material is a phase change material.

12. The lighting device of claim 1 wherein the generated electrical energy is used to aid in maintaining the low temperature material at a low temperature.

13. The lighting device of claim 1 wherein the generated electrical energy is used to aid in powering at least one additional LED.

14. The lighting device of claim 1 wherein the lighting device is supplied with DC voltage.

* * * * *